(12) United States Patent
Ota et al.

(10) Patent No.: US 10,657,885 B2
(45) Date of Patent: *May 19, 2020

(54) ELECTRO-OPTICAL DEVICE, DRIVING METHOD OF ELECTRO-OPTICAL DEVICE AND ELECTRONIC APPARATUS

(71) Applicant: SEIKO EPSON CORPORATION, Tokyo (JP)

(72) Inventors: Hitoshi Ota, Shiojiri (JP); Hideto Ishiguro, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 211 days.

This patent is subject to a terminal disclaimer.

(21) Appl. No.: 14/930,209

(22) Filed: Nov. 2, 2015

(65) Prior Publication Data
US 2016/0055796 A1    Feb. 25, 2016

Related U.S. Application Data

(63) Continuation of application No. 13/653,972, filed on Oct. 17, 2012, now Pat. No. 9,230,477.

(30) Foreign Application Priority Data

Oct. 18, 2011    (JP) .................................. 2011-228886

(51) Int. Cl.
*G09G 3/3233*    (2016.01)
*G09G 3/3275*    (2016.01)
*G11C 7/10*       (2006.01)

(52) U.S. Cl.
CPC ......... *G09G 3/3233* (2013.01); *G09G 3/3275* (2013.01); *G09G 2300/0426* (2013.01);
(Continued)

(58) Field of Classification Search
CPC ..... G09G 3/3233; G09G 3/3275–3291; G09G 2300/0426; G02F 1/13454; G11C 7/1051; G11C 7/10; G11C 7/1057
See application file for complete search history.

(56) References Cited

U.S. PATENT DOCUMENTS

| 6,825,836 B1 | 11/2004 | Stewart et al. |
| 8,059,140 B2 | 11/2011 | Kwon et al. |

(Continued)

FOREIGN PATENT DOCUMENTS

| JP | 2002-0516417 A | 6/2002 |
| JP | 2003-208127 A | 7/2003 |

(Continued)

*Primary Examiner* — Sanjiv D. Patel
(74) *Attorney, Agent, or Firm* — Oliff PLC

(57) ABSTRACT

A first storage capacitor is provided with respect to a data line. A pixel circuit includes a first transistor supplying current according to a voltage between a gate and a source, a light emitting element emitting light corresponding to current supplied by the first transistor, and a second transistor which is turned on or off between the data lines and the gate node. In a first period, an initial potential is supplied to the data line by turning on the second transistor, and in a second period, a data signal of a potential corresponding to a gradation level is supplied to the other end of the first storage capacitor by turning on the second transistor. After the second period, the second transistor is turned off.

5 Claims, 25 Drawing Sheets

(52) U.S. Cl.
CPC .............. *G09G 2300/0861* (2013.01); *G09G 2310/0294* (2013.01); *G09G 2310/0297* (2013.01); *G09G 2320/0233* (2013.01); *G11C 7/1057* (2013.01)

(56) References Cited

U.S. PATENT DOCUMENTS

| | | | |
|---|---|---|---|
| 2003/0103022 A1* | 6/2003 | Noguchi | G09G 3/3233 345/77 |
| 2004/0257136 A1* | 12/2004 | Osame | G09G 3/20 327/219 |
| 2005/0073488 A1 | 4/2005 | Shin | |
| 2005/0243034 A1 | 11/2005 | Chung et al. | |
| 2006/0071884 A1 | 4/2006 | Kim | |
| 2007/0035487 A1 | 2/2007 | Ryu et al. | |
| 2007/0040591 A1* | 2/2007 | Yu | G09G 3/3275 327/108 |
| 2007/0057873 A1* | 3/2007 | Uchino | G09G 3/3233 345/76 |
| 2007/0108443 A1* | 5/2007 | Kim | H01L 27/3202 257/40 |
| 2007/0120795 A1* | 5/2007 | Uchino | G09G 3/3233 345/92 |
| 2007/0124633 A1* | 5/2007 | Kim | G09G 3/2003 714/726 |
| 2007/0273619 A1 | 11/2007 | Kitazawa et al. | |
| 2009/0207110 A1* | 8/2009 | Lee | G09G 3/2022 345/82 |
| 2010/0295758 A1 | 11/2010 | Kawabe | |
| 2011/0050741 A1* | 3/2011 | Jeong | G09G 3/3233 345/690 |
| 2011/0074762 A1 | 3/2011 | Shirasaki et al. | |
| 2012/0062529 A1 | 3/2012 | Koyama | |
| 2016/0055804 A1* | 2/2016 | Kitadani | G09G 3/001 345/214 |

FOREIGN PATENT DOCUMENTS

| | | |
|---|---|---|
| JP | 2005-316381 A | 11/2005 |
| JP | 2005-321433 A | 11/2005 |
| JP | 2006-243176 A | 9/2006 |
| JP | 2007-316462 A | 12/2007 |
| JP | 2009-288435 A | 12/2009 |
| JP | 2011-033678 A | 2/2011 |

* cited by examiner

⟨(a) LIGHT EMITTING PERIOD⟩

<(b) INITIALIZATION PERIOD>

<(c) COMPENSATION PERIOD>

<(d) WRITING PERIOD>

<(d) WRITING PERIOD>

⟨(a) LIGHT EMITTING PERIOD⟩

⟨(b) INITIALIZATION PERIOD⟩

<(c) COMPENSATION PERIOD>

⟨(a) LIGHT EMITTING PERIOD⟩

<(b) INITIALIZATION PERIOD>

<(c) COMPENSATION PERIOD>

<(d) WRITING PERIOD>

US 10,657,885 B2

ELECTRO-OPTICAL DEVICE, DRIVING METHOD OF ELECTRO-OPTICAL DEVICE AND ELECTRONIC APPARATUS

CROSS-REFERENCE TO RELATED APPLICATIONS

This is a Continuation of application Ser. No. 13/653,972 filed Oct. 17, 2012, which claims the benefit of JP 2011-228886 filed Oct. 18, 2011, the disclosures of both of which are hereby incorporated by reference herein in their entirety.

BACKGROUND

1. Technical Field

The present invention relates to an electro-optical device, a driving method of an electro-optical device and an electronic apparatus effective when miniaturizing a pixel circuit, for example.

2. Related Art

In recent years, various kinds of electro-optical devices using light emitting elements such as organic light-emitting diode (Organic Light Emitting Diode, hereinafter referred to as "OLED") elements have been proposed. In such electro-optical devices, generally, a pixel circuit corresponding to the intersections of scanning lines and data lines and including the above-described light emitting elements or transistors is configured so as to be provided to correspond to pixels in an image to be displayed. In such a configuration, when a data signal of a potential corresponding to the gradation level of pixels is applied to the gate of the transistor, the transistor supplies a current corresponding to the voltage between the gate and the source to the light emitting element. In this manner, the light emitting element emits light with a luminance corresponding to the gradation level (for example, refer to JP-A-2007-316462).

Further, with respect to the electro-optical devices, there is often a demand for miniaturization of the display size or an increase in the high definition of the display. Since it is necessary to miniaturize the pixel circuit in order to achieve both miniaturization of the display size and an increase in the high definition of the display, for example, a technique of providing the electro-optical device with a silicon integrated circuit has also been proposed (for example, refer to JP-A-2009-288435).

Here, in the miniaturization of the pixel circuit, it is necessary to control the current supplied to the light-emitting element in a micro region. The current supplied to the light-emitting element is controlled according to the voltage between the gate and the source of the transistor; however, in the micro region, the current supplied to the light-emitting element is greatly changed with respect to slight changes in the voltage between the gate and the source.

Meanwhile, the driving capability of the circuit outputting the data signal is increased in order to charge the data lines in a short time. In a circuit having a high driving capability in this manner, it is difficult to output the data signal with extremely fine precision.

SUMMARY

An advantage of some aspects of the invention is that it provides an electro-optical device, a driving method of an electro-optical device and an electronic apparatus capable of controlling the current supplied to a light emitting element with high precision without a need for a data signal with fine precision.

According to an aspect of the invention, there is provided an electro-optical device, including: a plurality of scanning lines; a plurality of data lines; a first storage capacitor of which one end is connected to the data lines; a second storage capacitor respectively holding various potentials of the plurality of data lines; a pixel circuit provided so as to correspond to intersections of the plurality of scanning lines and the plurality of data lines; and a driving circuit driving the pixel circuit, in which the pixel circuit includes a first transistor supplying current according to a voltage between a gate and a source, a light emitting element emitting light with a luminance corresponding to current supplied by the first transistor, and a second transistor which is turned on or off between the data lines and the gate of the first transistor, and in which the driving circuit supplies an initial potential to the data lines along with turning on the second transistor in a first period, supplies a data signal of potential corresponding to a gradation level to another end of the first storage capacitor in a state where the second transistor is turned on in a second period continuing from the first period, and turns off the second transistor after the second period. According to another aspect of the invention, in the first period, the data line and the gate of the first transistor are held at an initial potential by the second storage capacitor. In the second period, in a state where the second transistor is turned on, when the data signal of the potential corresponding to the gradation level is supplied to the other end of the first storage capacitor, the potential of the data lines and the gate of the first transistor is shifted by an amount by which the potential change in the other end of the first storage capacitor is voltage-divided by the capacity ratio of the first storage capacitor and the second storage capacitor. For this reason, according to another aspect of the invention, since the potential range at the gate of the first transistor is narrowed with respect to the potential range of the data signal, it is possible to accurately control the current even in a case where the current change with respect to the voltage change between the gate and source of the first transistor is large.

In the invention, it is preferable that the driving circuit is configured to start the supply of the initial potential to the data lines in a state where the second transistor is turned off before the first period. According to this configuration, after the data lines are first reset to the initial potential as a separate body, the second transistor is turned on in the first period and the gate of the first transistor is initialized.

In this configuration, it is preferable that the pixel circuit has a third transistor which is turned on or off between the first transistor and the light emitting element, and the driving circuit turns the third transistor on in a third period continuing from the second period. According to such an aspect, after the shift potential of the data signal is written to the gate of the first transistor, current is supplied to the light emitting element.

In addition, in the above-described aspect, the driving circuit may turn off the third transistor before the first period. In this manner, it is possible to set the current not to be supplied to the light emitting element in the first period in which the gate of the first transistor is an initial potential and the second period of shifting from the initial potential.

The pixel circuit may include a third storage capacitor holding the voltage between the gate and the source of the first transistor. This third storage capacitor may be a parasitic capacitance of the first transistor, or may be a capacitive element provided separately.

Here, as well as the electro-optical device, the invention can also be conceptualized as a driving method of an electro-optical device or an electronic apparatus having the electro-optical device. As the electronic apparatus, typically, a display apparatus such as a head-mounted display (HMD), an electronic view finder, or the like may be exemplified.

BRIEF DESCRIPTION OF THE DRAWINGS

The invention will be described with reference to the accompanying drawings, wherein like numbers reference like elements.

FIG. 25 is a perspective view showing an HMD using the electro-optical device according to the embodiments and the like.

DESCRIPTION OF EXEMPLARY EMBODIMENTS

Below, aspects for embodying the invention will be described with reference to the drawings.

First Embodiment

Figure 1:
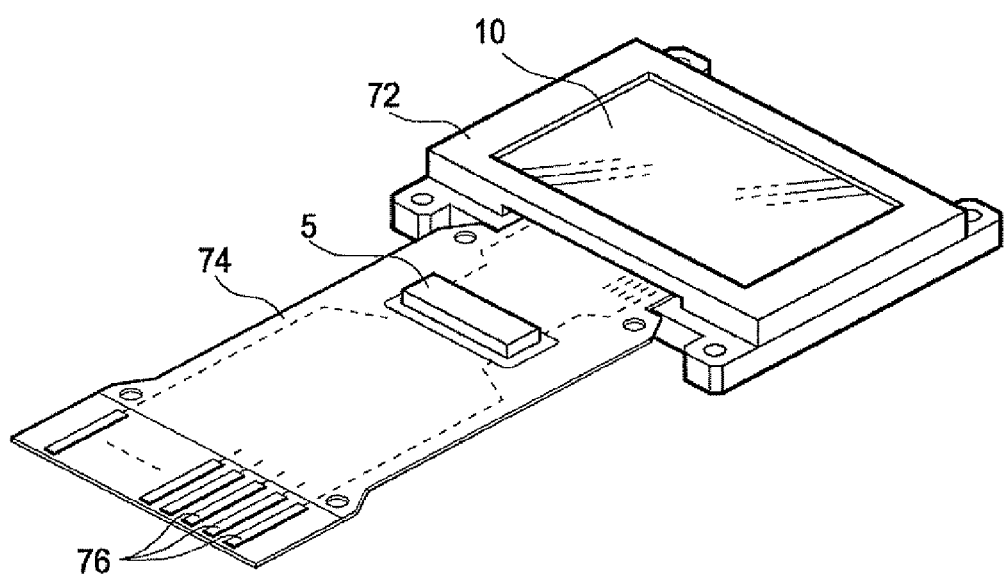
FIG. 1 is a perspective view illustrating a configuration of an electro-optical device according to a first embodiment of the invention.

FIG. 1 is a perspective view showing a configuration of an electro-optical device 10 according to an embodiment of the invention.

The electro-optical device 10 is a micro display displaying an image in a head mounted display, for example. The electro-optical device 10 will be described in detail below; however, it is an organic EL apparatus in which a plurality of pixel circuits, driving circuits driving the pixel circuits, and the like are, for example, formed on a silicon substrate, and in which an OLED which is an example of a light emitting element is used in the pixel circuits.

As well as being accommodated in a frame-shaped case 72 opening at a display unit, the electro-optical device 10 is connected to one end of a FPC (Flexible Printed Circuit) substrate 74. In the FPC substrate 74, a control circuit 5 of a semiconductor chip is mounted using a COF (Chip On Film) technique and a plurality of terminals 76 are provided and connected to a higher circuit omitted from the drawings. Image data is synchronized with a synchronization signal and supplied via the plurality of terminals 76 from the higher circuit. The synchronization signal includes a vertical synchronization signal, a horizontal synchronization signal, and a dot clock signal. In addition, the image data regulates the gradation level of the pixels of the image to be displayed, for example, using 8 bits.

The control circuit 5 is one combining the functions of a power circuit of the electro-optical device 10 and a data signal output circuit. That is, the control circuit 5 supplies various types of control signals generated according to the synchronization signal and various types of potential to the electro-optical device 10, and converts the digital image data into an analog data signal to be supplied to the electro-optical device 10.

Figure 2:
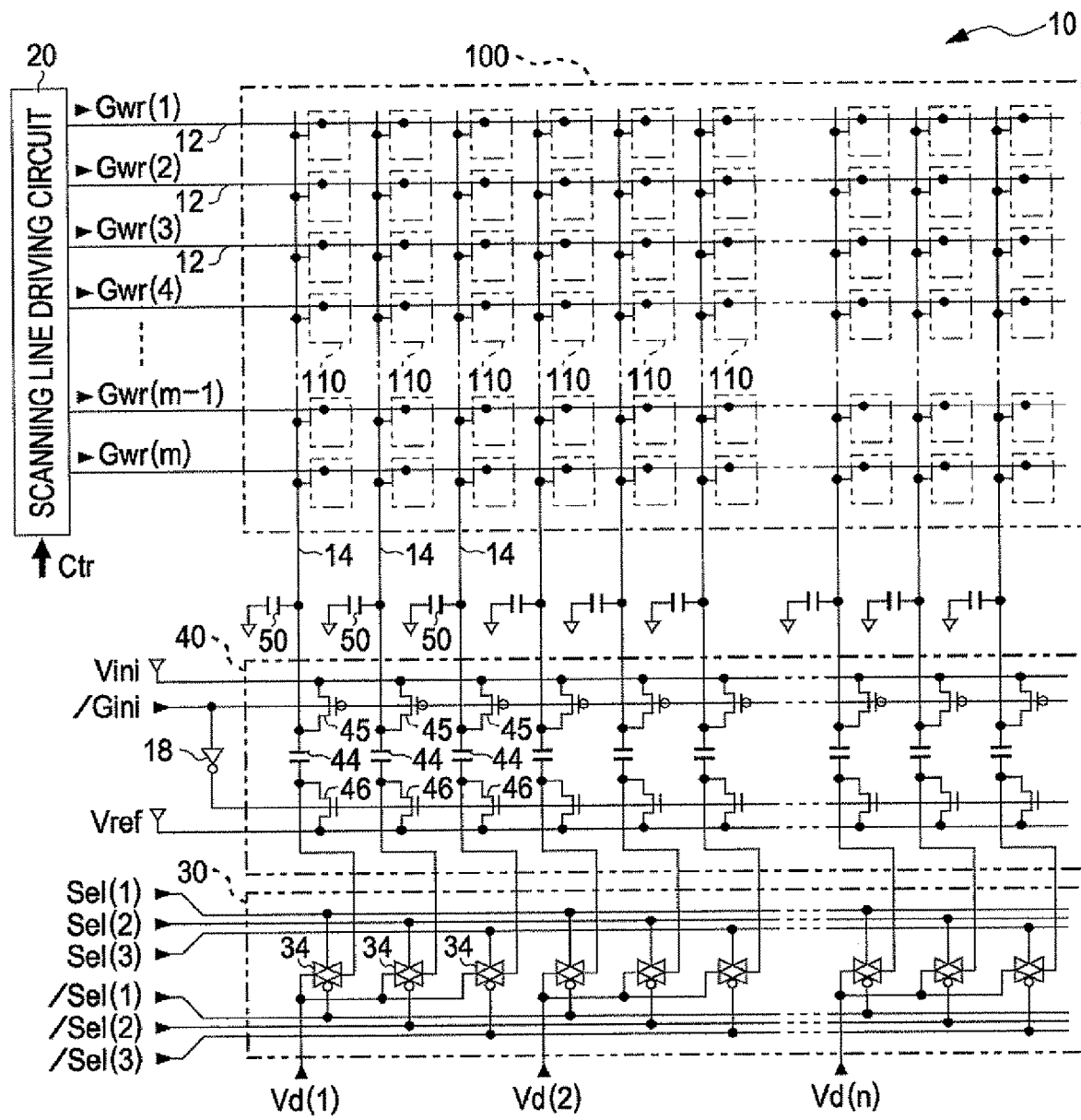
FIG. 2 is a diagram showing a configuration of the electro-optical device.

FIG. 2 is a diagram showing a configuration of an electro-optical device 10 according to the first embodiment. As shown in the diagram, the electro-optical device 10 is divided into a scanning line driving circuit 20, a demultiplexer 30, a level shift circuit 40, and a display unit 100.

Among these, in the display unit 100, pixel circuits 110 corresponding to pixels of the image to be displayed are arranged in a matrix form. In detail, in the display unit 100, scanning lines 12 of m rows are provided to extend in the horizontal direction in the diagram, and, furthermore, data lines 14 of (3n) columns grouped in sets of three are provided to extend in the vertical direction in the diagram and preserve the mutual electrical insulation with each scanning line 12. Here, the pixel circuits 110 are provided corresponding to intersection portions of m rows of scanning lines 12 and (3n) columns of data lines 14. For this reason, the pixel circuits 110 in the present embodiment are arranged in a matrix form with m rows vertically and (3n) columns horizontally.

Here, m and n are both natural numbers. In the matrix of the scanning lines 12 and the pixel circuit 110, in order to distinguish between the rows, the rows have been numbered 1, 2, 3, . . . , (m−1), and m in order from the top in the diagram. In the same manner, in order to distinguish between the columns of the matrix of the data lines 14 and the pixel circuits 110, the columns have been numbered 1, 2, 3, ..., (3n−1), and (3n) in order from the left in the diagram. In addition, when an integer j of 1 or more and n or less is used in order to generalize and describe a group of the data lines 14, the (3j−2)th column, the (3j−1)th column, and the (3j)th column of the data lines 14 belong to the jth group counting from the left.

Here, three pixel circuits 110 corresponding to intersections of scanning lines 12 of the same row and three columns of data lines 14 belonging to the same group correspond to pixels of R (red), G (green), and B (blue) respectively and these three pixels represent one dot of a color image to be displayed. That is, the present embodiment has a configuration in which colors of one dot are represented by adding and mixing colors according to the light emission of OLEDs corresponding to RGB.

Here, in the electro-optical device 10, the following kind of control signal is supplied by the control circuit 5. In detail, in the electro-optical device 10, a control signal Ctr for controlling the scanning line driving circuit 20, control signals Sel(1), Sel(2), and Sel(3) for controlling the selection with the demultiplexer 30, control signals /Sel(1), /Sel(2), and /Sel(3) in a logic inversion relationship with respect to these signals, and a negative logic control signal /Gini for controlling the level shift circuit 40, are supplied. Here, in practice, the control signal Ctr includes a plurality of signals such as a pulse signal, a clock signal, and an enable signal.

Further, in the electro-optical device 10, data signals Vd(1), Vd(2), ..., Vd(n) matching the selection timing of the demultiplexer 30 are supplied by the control circuit 5 to correspond to groups numbered 1, 2, ..., n. Here, the highest value of the potential obtainable by the data signals Vd(1) to Vd(n) is set as Vmax and the lowest value is set to Vmin.

The scanning line driving circuit 20 generates scanning signals for scanning the scanning lines 12 one row at a time in order over a frame period in accordance with the control signal Ctr. Here, the scanning signals supplied to the scanning lines 12 of 1, 2, 3, ..., (m−1), m rows are respectively denoted as Gwr(1), Gwr(2), Gwr(3), ..., Gwr(m−1), and Gwr(m).

In addition, apart from the scanning signals Gwr(1) to Gwr(m), the scanning line driving circuit 20 generates various types of control signals synchronized with the scanning signals for each row and performs supply thereof to the display unit 100; however, such illustration is omitted in FIG. 2. Further, the frame period refers to a period necessary for the electro-optical device 10 to display one cut (frame) part of an image, for example, if the frequency of the vertical synchronization signal included in the synchronization signal is 120 Hz, the period is 8.3 milliseconds which is the duration of one cycle.

The demultiplexer 30 is an assembly of transmission gates 34 provided at each column and supplies data signals in order to the three columns configuring each group.

Here, the input ends of the transmission gate 34 corresponding to columns (3j−2), (3j−1), and 3(j) belonging to the j-numbered groups are mutually connected in common and respective data signals Vd(j) are supplied to the common terminals.

The transmission gate 34 provided at column (3j−2) at the left end column in the j-numbered groups is turned on (conducts) when the control signal Sel(1) is the H level (when the control signal /Sel(1) is the L level). Similarly, the transmission gate 34 provided at column (3j−1) at the center column in the j-numbered groups is turned on when the control signal Sel(2) is the H level (when the control signal /Sel(2) is the L level), and the transmission gate 34 provided at column (3j) at the right end column in the j-numbered groups is turned on when the control signal Sel(3) is the H level (when the control signal /Sel(3) is the L level).

The level shift circuit 40 has a set of a storage capacitor 44, a P-channel MOS-type transistor 45 and an N-channel MOS-type transistor 46 for each column respectively, and shifts the potential of the data signal output from the output end of the transmission gate 34 of each column. Here, one end of the storage capacitor 44 is connected to a data line 14 of a corresponding column and a drain node of a transistor 45 while the other end of the storage capacitor 44 is connected to the output end of the transmission gate 34 and the drain node of the transistor 46. For this reason, the storage capacitor 44 functions as a first storage capacitor in which one end is connected to the data line 14. Further, although omitted from FIG. 2, the capacity of the storage capacitor 44 is set as Crf1.

The initial potential Vini is fed in common across each column to the source node of the transistor 45 of each column and the control signal /Gini is supplied in common across each column to the gate node. Further, the potential Vref is fed in common across each column to the source node of the transistor 46 of each column and a signal in which the control signal /Gini is logic inverted by a NOT circuit 18 is supplied in common across each column to the gate node.

Therefore, in the present embodiment, the transistors 45 and 46 of each column are configured so as to be turned on in unison when the control signal /Gini is L level and turned off in unison when the control signal /Gini is H level.

The storage capacitor 50 is provided in each data line 14. More specifically, one end of the storage capacitor 50 is connected to the data line 14, and the other end, for example, is grounded to a common potential Vss across each column. For this reason, the storage capacitor 50 functions as a second storage capacitor holding the potential of the data line 14.

Here, the storage capacitor 50 is provided on the outside of the display unit 100 in FIG. 2; however, this is only an equivalent circuit and provision may naturally be made on the inside of the display unit 100 or from the inside to the outside thereof. Further, although omitted from FIG. 2, the capacity of the storage capacitor 50 is set as Cdt. The potential Vss is equivalent to the L level of the scanning signal or control signal, which are logic signals.

In the present embodiment, the scanning line driving circuit 20, the demultiplexer 30, and the level shift circuit 40 are divided according to convenience; however, these can be conceived together as a driving circuit driving the pixel circuit 110.

The pixel circuit 110 will be described with reference to FIG. 3. Since each pixel circuit 110 has the same configuration as the others in electrical terms, here, description will be given taking the pixel circuit 110 of the i-th row (3j−2) column positioned at the (3j−2)th column of the left end side in the j-numbered group in the i-th row as an example.

Here, i is a sign used in a case to generally show a row in which the pixel circuit 110 is arranged, and is an integer of one or more and m or less.

Figure 3:
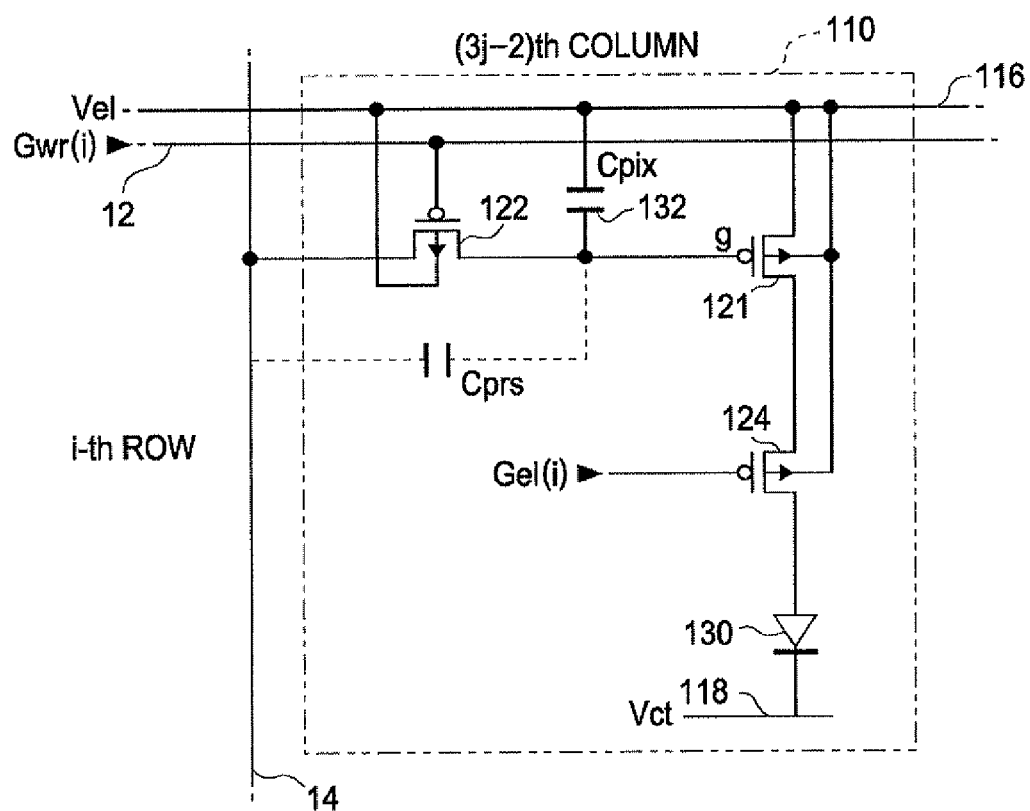
FIG. 3 is a diagram showing a pixel circuit of the electro-optical device.

As shown in FIG. 3, the pixel circuit 110 includes P-channel MOS-type transistors 121, 122, and 124, an OLED 130 and a storage capacitor 132.

The scanning signal Gwr(i) and the control signal Gel(i) are supplied to the pixel circuit 110. Here, the scanning signal Gwr(i) and the control signal Gel(i) are supplied by the scanning line driving circuit 20 in correspondence with the respective i-th rows. For this reason, in the case of an i-th row, the scanning signal Gwr(i) and the control signal Gel(i) are also supplied in common to the pixel circuits of other columns other than column (3j−2) being focused on.

In the transistor 122 in the pixel circuit 110 of the i-th row, (3j−2) column, the gate node is connected to the scanning line 12 of the i-th row, one of the drain or source node is connected to the data line 14 of the (3j−2) column, and the other is respectively connected to the gate node in the transistor 121 and one end of the storage capacitor 132. Here, the gate node of transistor 121 is denoted as g so as to be distinguished from other nodes.

In the transistor 121, the source node is connected to the feed line 116 and the drain node is connected to the source node of the transistor 124. Here, the potential Vel which is the high-order side of the power source in the pixel circuit 110 is fed to the feeding line 116.

In the transistor 124, the control signal Gel(i) corresponding to the i-th row is supplied to the gate node and the drain node is connected to the anode of the OLED 130.

Here, the transistor 121 is equivalent to a first transistor, the transistor 122 is equivalent to a second transistor, and the transistor 124 is equivalent to a third transistor.

The other end of the storage capacitor 132 is connected to the feed line 116. For this reason, the storage capacitor 132 functions as a third storage capacitor holding the voltage between the source and drain of the transistor 121. Here, when the capacity of the storage capacitor 132 is denoted as Cpix, the capacity Cdt of the storage capacitor 50, the capacity Crf1 of the storage capacitor 44, and the capacity Cpix of the storage capacitor 132 are set so that:

Cdt>Crf1>>Cpix

That is, Cdt is greater than Crf1, and Cpix is set to be sufficiently smaller than Cdt and Crf1.

Here, as the storage capacitor 132, a capacity which is parasitic to the gate node g of the transistor 121 may be used, and a capacity formed by interposing an insulating layer with mutually different conductive layers in a silicon substrate may be used.

Since the electro-optical device 10 in the present embodiment is formed on silicon substrate, the substrate potential of the transistors 121, 122, and 124 is set as the potential Vel.

The anode of the OLED 130 is a pixel electrode provided individually for each pixel circuit 110. In contrast, the cathode of the OLED 130 is a common electrode 118 which is common across all of the pixel circuits 110, and is preserved at a potential Vct which is a low-order side of the power source in the pixel circuits 110.

The OLED 130 is an element interposing a white organic EL layer between the anode and the cathode having a light-permeable characteristic in the above-described silicon substrate. Then, a color filter corresponding to any one of RGB is superimposed on the output side (cathode side) of the OLED 130.

In such an OLED 130, when a current flows from the anode to the cathode, holes injected from the anode and electrons injected from the cathode are recombined in the organic EL layer to generate excitons, whereby white light is generated. A configuration is adopted in which the white light generated at this time is transmitted through the cathode on the opposite side to the silicon substrate (anode) colored using the color filter, and made visible on the observer side.

Operation of First Embodiment

Figure 4:
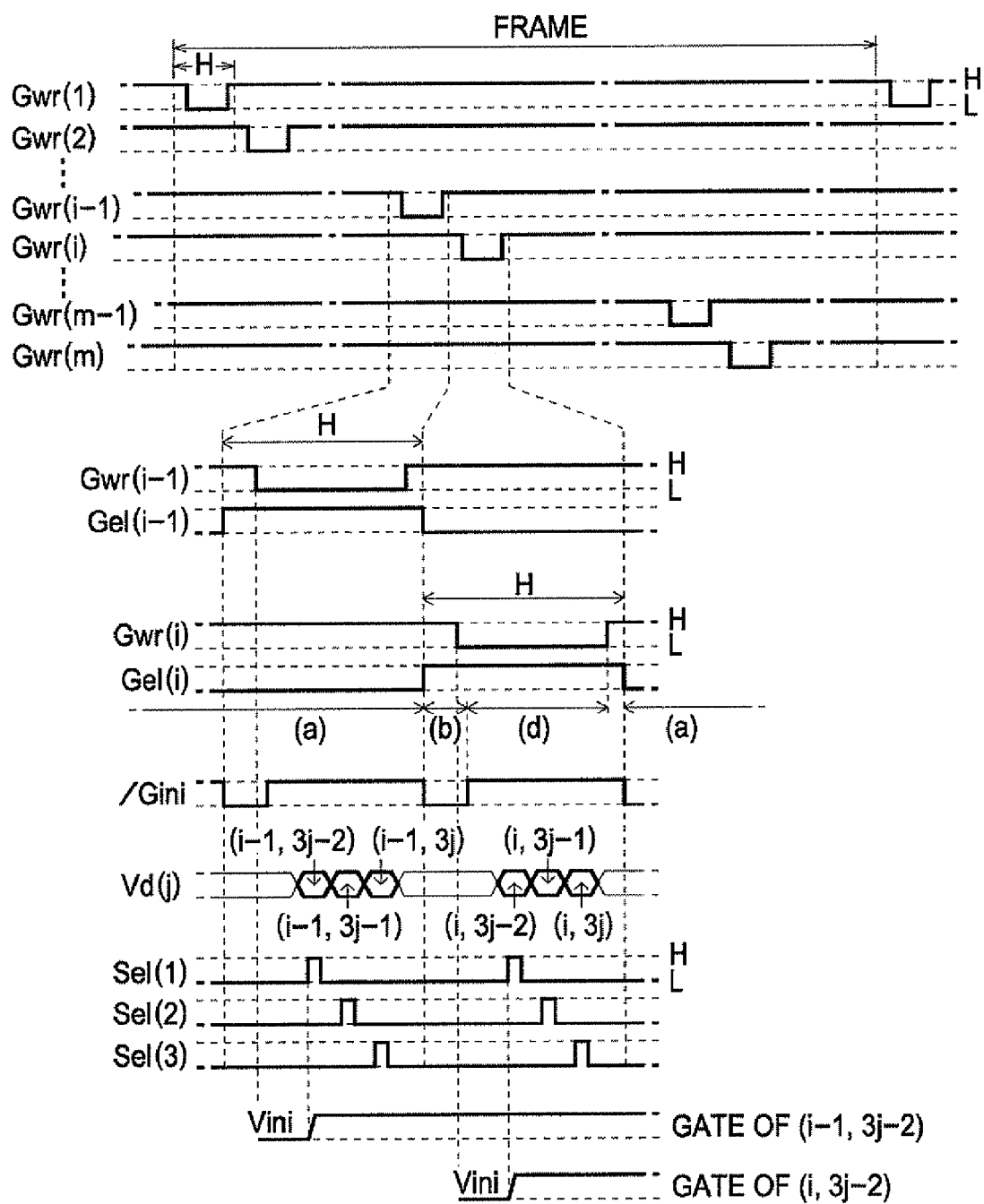
FIG. 4 is a timing chart showing an operation of the electro-optical device.

The operation of the electro-optical device 10 will be described with reference to FIG. 4. FIG. 4 is a timing chart for illustrating the operation of each part in the electro-optical device 10. Here, in the drawings, the vertical scale showing the voltage amplitude is not necessarily consistent for convenience of description (the same applies in FIG. 13 and FIG. 20 below).

As shown in the drawings, the scanning signals Gwr(1) to Gwr(m) are sequentially switched to the L level and the scan lines 12 of rows 1 to m are scanned in order for each horizontal scanning period (H) in a period of one frame.

The operation in one horizontal scanning period (H) is common across the pixel circuits 110 of each row. Here, below, in the scanning period in which the i-th rows are horizontally scanned, description will be given of the operation with particular focus on the pixel circuit 110 of the i-th row (3j−2) column.

In the present embodiment, to make broad classifications, the scan period of the i-th row is divided into the initialization period shown by (b) in FIG. 4 and the writing period shown by (d). Here, after the writing period (d), there is an interval before entering the light emitting period shown by (a), which leads to the scanning period of the i-th row again after the one frame period has elapsed. For this reason, with regard to the chronological order, the cycle of (light emitting period)→initialization period→writing period→(light emitting period) is repeated.

Here, in FIG. 4, each of the scan signal Gwr(i−1) and the control signal Gel(i−1) corresponding to the (i−1) row one row before the i-th row is a waveform chronologically preceding the scan signal Gwr(i) and the control signal Gel(i) corresponding to the i-th row by the time of one horizontal scanning period (H) respectively.

Light Emitting Period

Figure 5:
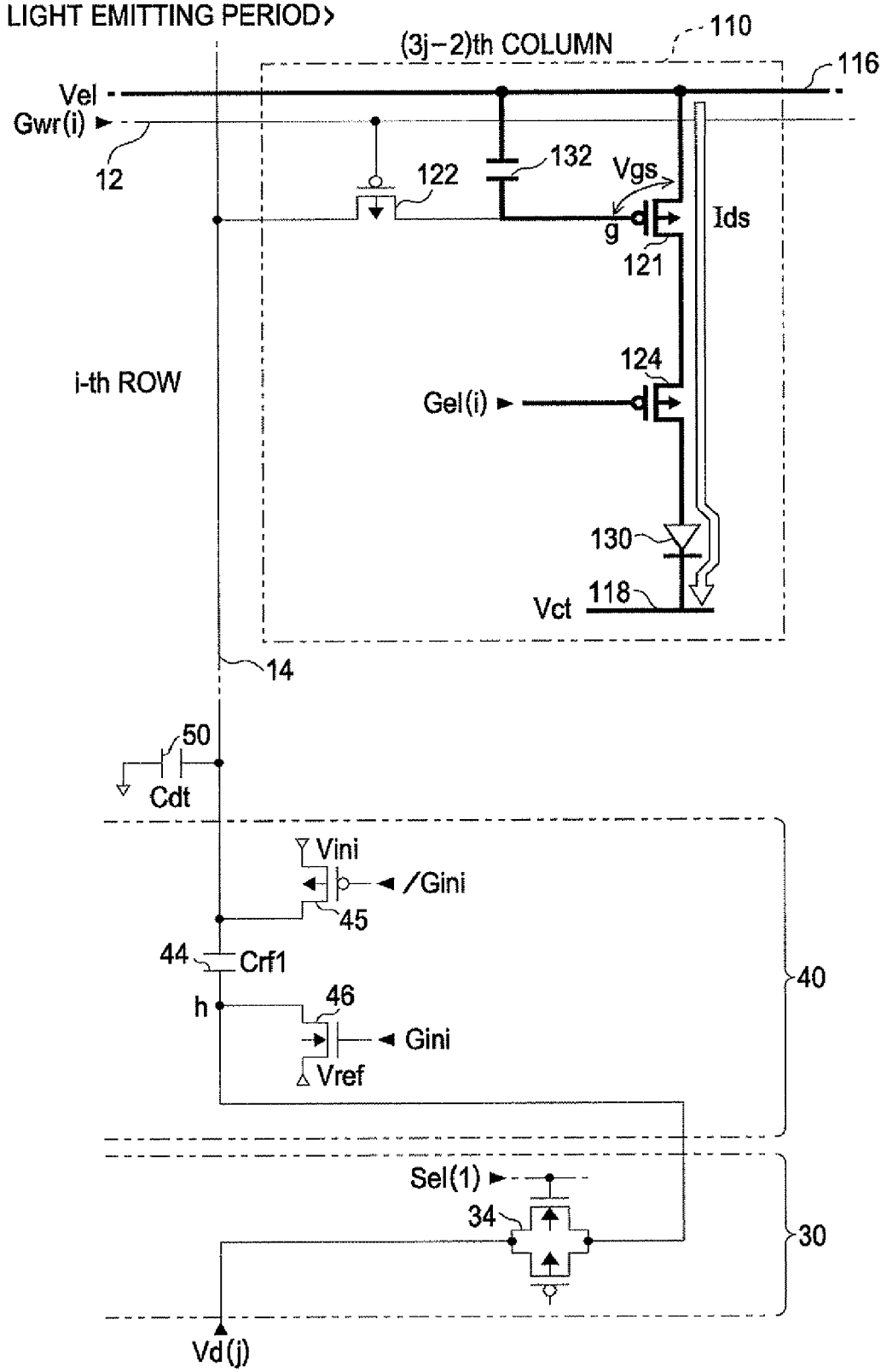
FIG. 5 is an explanatory diagram of an operation of the electro-optical device.

For convenience of explanation, description will be given from the light emitting period which is a prerequisite for the initialization period. As shown in FIG. 4, in the light emitting period of the i-th row, the scan signal Gwr(i) is the H level and the control signal Gel(i) is the L level. For this reason, in the pixel circuit 110 of I-th row (3j−2) column as shown in FIG. 5, the transistor 124 is turned on while the transistor 122 is turned off. Accordingly, the transistor 121 supplies the current Ids according to the voltage held by the storage capacitor 132, that is, the voltage Vgs between the gate and the source, to the OLED 130. Since the potential of the gate node g in the light emitting period to be described later is a value in which the data signal of the potential according to the gradation level is level shifted according to the capacity ratio of the holding capacities 44 and 50, the voltage Vgs becomes a voltage corresponding to the gradation. For this reason, since the transistor 121 supplies a current corresponding to the gradation level, the OLED 130 emits light at a luminance corresponding to the current.

Here, since the light emitting period of the i-th row is a period in which horizontal scanning other than of the i-th row is performed, the potential of the data line 14 changes appropriately. However, since the transistor 122 is turned off in the i-th row of the pixel circuit 110, here, the potential change of the data line 14 is not taken into consideration.

In addition, in FIG. 5, the route which is important in the operation description is shown with a bold line (the same applies in FIGS. 6 to 9, FIGS. 14 to 17, and FIGS. 21 to 24 below).

Initialization Period

Next, when the scanning period of the i-th row is reached, first, the initialization period of (b) is started. In the initialization period, in contrast to the light emitting period, the control signal Gel(i) becomes the H level.

Figure 6:
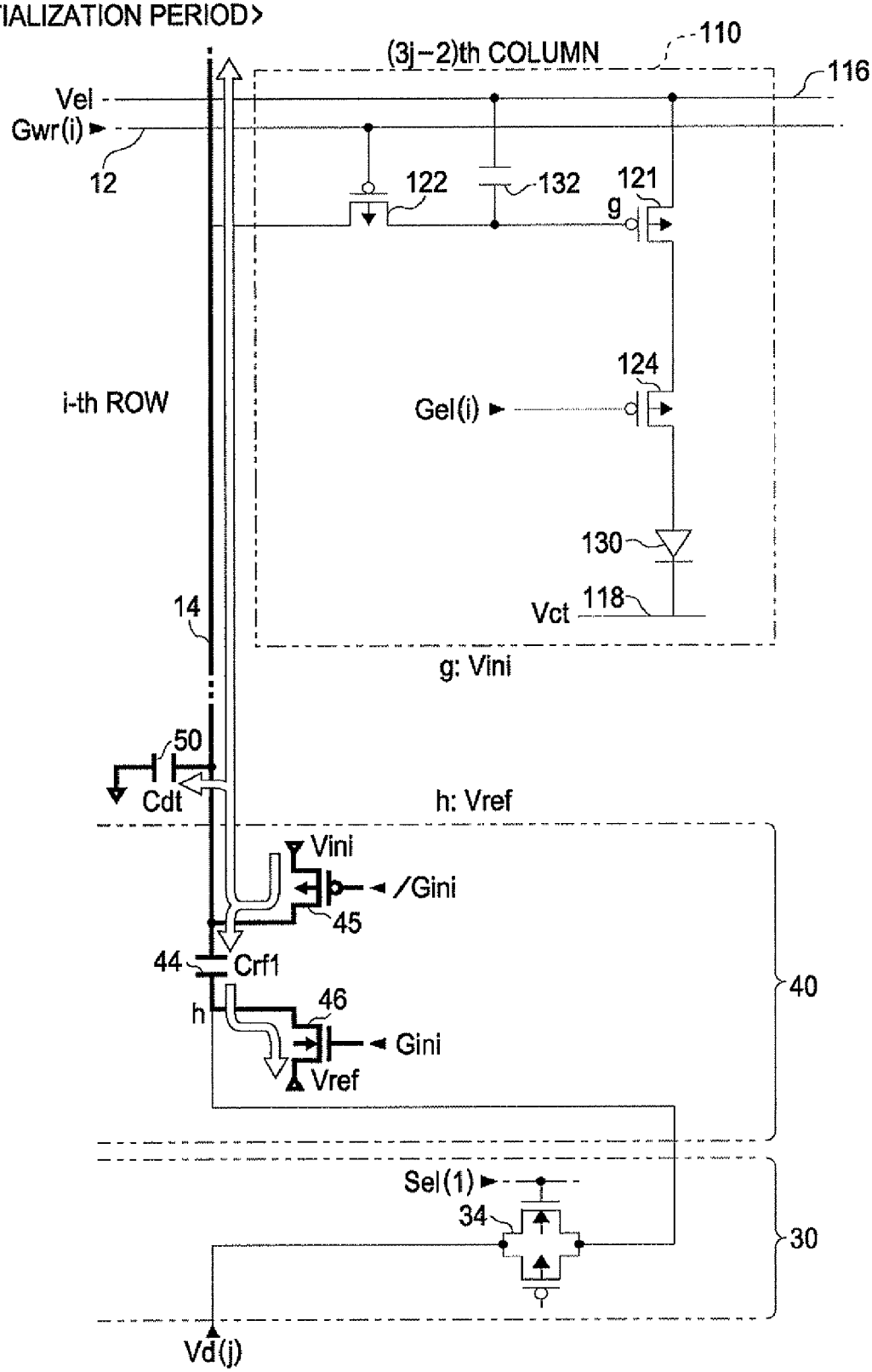
FIG. 6 is an explanatory diagram of an operation of the electro-optical device.

For this reason, in the pixel circuit 110 of the i-th row ($3j$−2) column as shown in FIG. 6, the transistor 124 is turned off. In this manner, since the route of the current supplied to the OLED 130 is interrupted, the OLED 130 enters an off (non-light emitting) state.

Meanwhile, since the control signal /Gini becomes the L level in the initialization period, in the level shift circuit 40, the transistors 45 and 46 as shown in FIG. 6 are respectively turned on. For this reason, the data line 14 which is one end of the storage capacitor 44 and the node h which is the other end of the storage capacitor 44 are respectively initialized at a potential Vini and a potential Vref.

Figure 7:
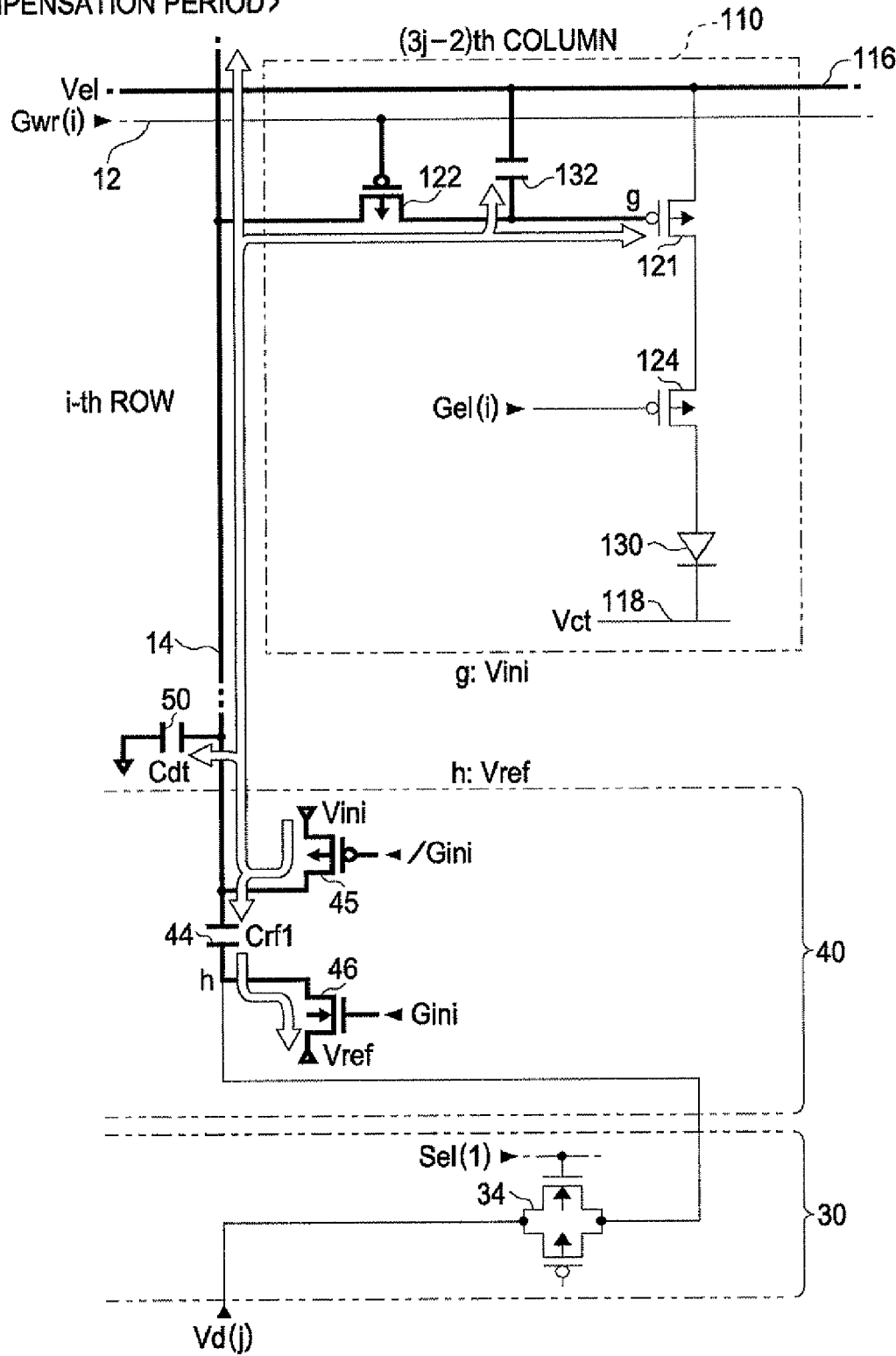
FIG. 7 is an explanatory diagram of an operation of the electro-optical device.

In the initialization period, next, the scan signal Gwr(i) becomes the L level (first period) in a state where the control signal /Gini is an L level. For this reason, since the transistor 122 is turned on in the pixel circuit 110 of the i-th row ($3j$−2) column as shown in FIG. 7, the gate node g enters a state of being electrically connected to the data line 14. Accordingly, since the gate node g also becomes a potential Vini, the holding voltage of the storage capacitor 132 is initialized to (Vel−Vini) from the voltage held in the light emitting period.

Writing Period

After the initialization period, the writing period of (d) is reached as the second period. In the writing period, since the scanning signal /Gini becomes the H level in a state where the scanning signal Gwr(i) is the L level, the transistors 45 and 46 are respectively turned off in the level shift circuit 40.

Figure 8:
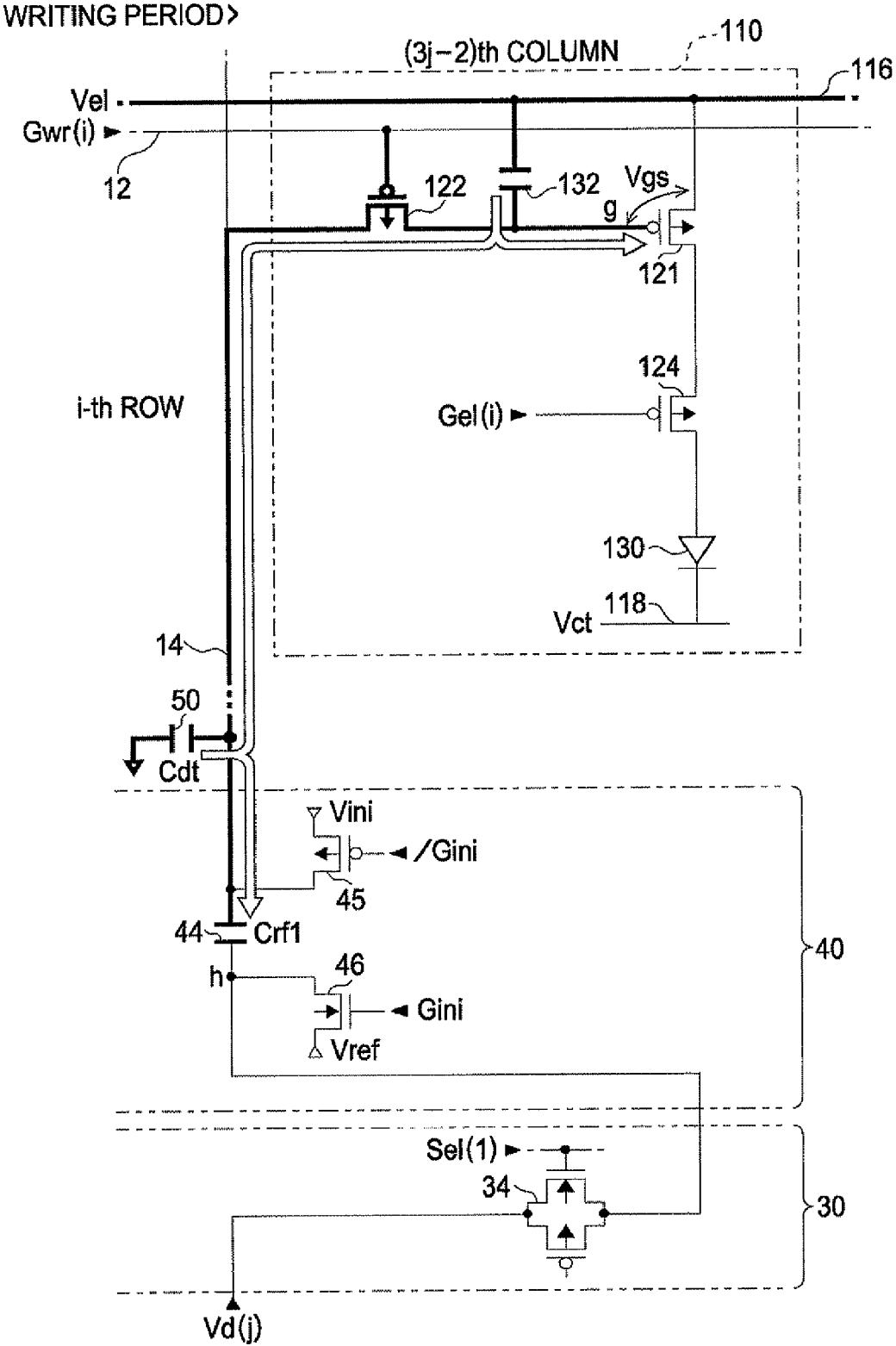
FIG. 8 is an explanatory diagram of an operation of the electro-optical device.

For this reason, as shown in FIG. 8, the route leading up to the gate node g in the pixel circuit 110 of the i-th row ($3j$−2) column from the data line 14 of the ($3j$−2)th column is in a floating state; however, since the other end of the storage capacitor 50 is grounded to the potential Vss and the other end of the storage capacitor 132 is connected to the feed line 116, the data signal is maintained at the potential Vini until it is supplied by turning on the transmission gate 34.

The control circuit 5 outputs the following kind of data signal in the writing period of the i-th row. That is, regarding the j-numbered group, the control circuit 5 sequentially switches the data signal Vd(j) in order of the potential according to the gradation level of the pixels of the column ($3j$−2) of the left end column, the column ($3j$−1) of the center column, and the column ($3j$) of the right end column belonging to the group of the i-th row. The control circuit 5 sequentially switches the potential in the same manner for data signals to other groups.

Meanwhile, the control circuit 5 sequentially sets the control signals Sel(1), Sel(2), and Sel(3) in order exclusively to the H level in combination with the switching of the potential of the data signal. In addition, although omitted in FIG. 4, the control circuit 5 performs output for the control signals /Sel(1), /Sel(2), and /Sel(3), which have a logic inverted relationship with the control signals Sel(1), Sel(2), and Sel(3). In this manner, in the demultiplexer 30, the transmission gates 34 are turned on in order of the left end column, the center column, and the right end column respectively in each group.

Figure 9:
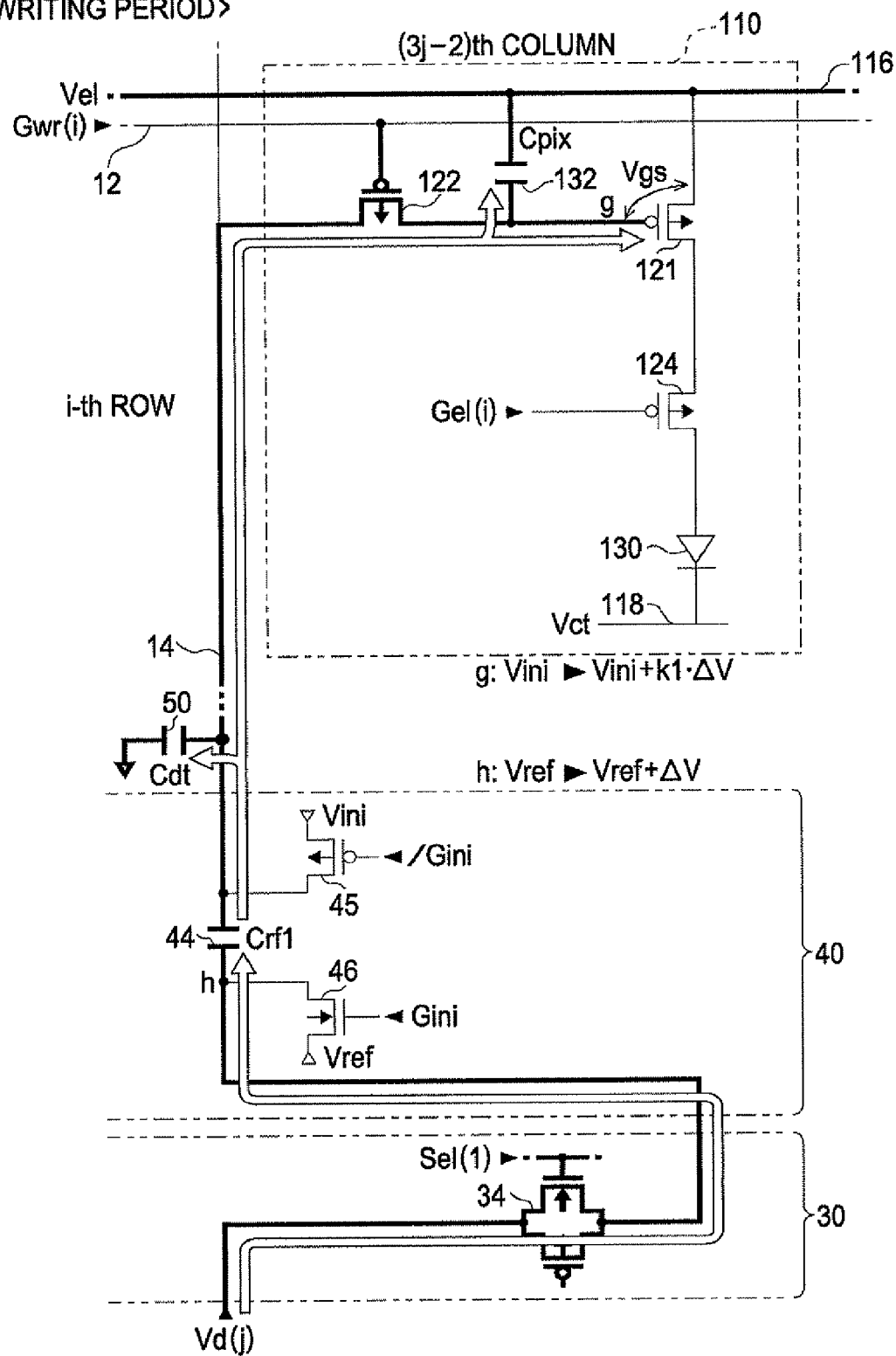
FIG. 9 is an explanatory diagram of an operation of the electro-optical device.

Here, when the transmission gate 34 of the left end column belonging to the j-numbered group is turned on by the control signals Sel(1) and /Sel(1), as shown in FIG. 9, the node h which is the other end of the storage capacitor 44 is changed to the potential of the data signal Vd(j) from the initialized potential Vref, that is, the potential according to the gradation level of the pixels of the i-th row ($3j$−2) column. The potential change amount of the node h at this time is represented as $\Delta V$, and the potential after the change as (Vref+$\Delta V$).

Meanwhile, since the gate node g is in a state of being electrically connected to one end of the storage capacitor 44 through the data line 14, the value of the shift in the change direction of the node h is a value obtained by multiplying the potential change amount $\Delta V$ of the node h from the potential Vini by the capacity ratio k1.

In addition, the capacity ratio k1 is Crf1/(Cdt+Crf1). Strictly speaking, the capacity Cpix of the storage capacitor 132 must also be considered; however, since the capacity Cpix is set to be sufficiently small in comparison with the capacities Crf1 and Cdt, it may be ignored.

Figure 10:
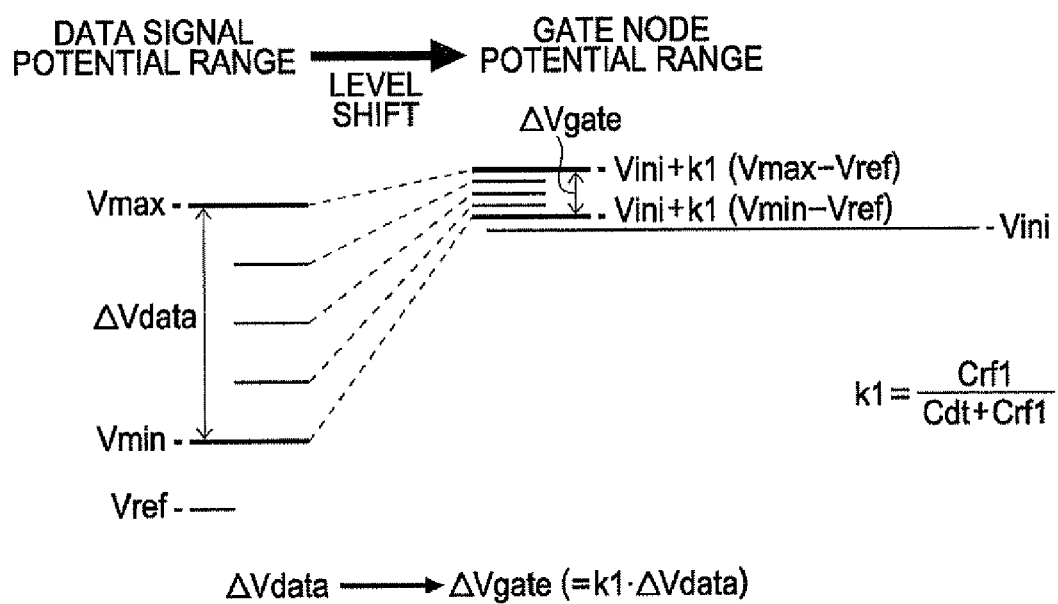
FIG. 10 is a diagram showing amplitude compression of a data signal in the electro-optical device.

FIG. 10 is a diagram showing the relationship between the potential of the data signal and the potential of the gate node g in the writing period. The data signal supplied from the control circuit 5 can obtain a potential range from the minimum value Vmin to the maximum value Vmax according to the gradation level of the pixels as described above. In the present embodiment, the data signal is not written to the direct gate node g, but level-shifted as shown in the diagram and written to the gate node g.

At this time, the potential range $\Delta V$ gate of the gate node g is compressed to a value obtained by multiplying the potential range $\Delta V$ data (=Vmax−Vmin) of the data signal by the capacity ratio k1. For example, when the capacities of the holding capacities 44 and 50 are set so that Crf1:Cdt=1:9, the potential range $\Delta V$ gate of the gate node g can be compressed to $\frac{1}{10}$ of the potential range $\Delta V$ data of the data signal.

In addition, the extent to which the potential range $\Delta V$ gate of the gate node g is shifted in which direction with respect to the potential range $\Delta V$ data of the data signal can be set using the potential Vini and Vref. This is because, when the potential range $\Delta V$ data of the data signal is compressed with the capacity ratio k1 with the potential Vref as a reference and, along with this, the compression range shifts the potential Vini to the reference, the result is the potential range $\Delta V$ gate of the gate node g.

In this manner, in the writing period of the i-th row, the potential in which the data signal of the potential according to the gradation level is level shifted according to the capacity ratio of the holding capacities 44 and 50 is written to the gate node g of the pixel circuit 110 of the i-th row.

After a short time, the scanning signal Gwr(i) becomes the H level and the transistor 122 is turned off. In this manner, the writing period is finished and the potential of the gate node g is determined as the shifted value.

Light Emitting Period

After the writing period of the i-th row finishes, there is an interval leading to the light emitting period as the third period. In the light emitting period, since the control signal Gel(i) becomes the L level as described above, in the pixel circuit 110 of the i-th row ($3j$−2) column, the transistor 124 is turned on. For this reason, as shown previously in FIG. 5, since a current Ids according to the voltage Vgs between the gate and the source is supplied to the OLED 130 by the transistor 121, the OLED 130 emits light at a luminance corresponding to the current.

These kinds of operations are chronologically performed in parallel even in the pixel circuit 110 of the i-th row other than the pixel circuit 110 of the ($3j$−2)th column being focused on in the scanning period of the i-th row. In addition, this operation of the i-th row is performed in order of the 1, 2, 3, . . . , (m−1), m rows in the period of one frame in practice and this is repeated for each frame.

Here, FIG. 4 respectively shows the point that the gate node g in the pixel circuit 110 of the i-th row ($3j$−2) column is level shifted from the potential Vini by the control signal Sel(1) becoming the H level and the point that the gate node of the (i−1) row (3j−2) column of one row before which is the same column as the i-th row (3j−2) column is level shifted from the potential Vini.

According to the present embodiment, since the potential range ΔV gate in the gate node g is narrowed with respect to the potential range ΔV data of the data signal, it is possible to apply a voltage reflecting the gradation level between the gate and source of the transistor 121 even without cutting up the data signal with fine precision. For this reason, even in a case where a micro current flowing to the OLED 130 with respect to changes in the voltage Vgs between the gate and the source of the transistor 121 in the miniaturized pixel circuit 110 is changed to a relatively large extent, it is possible to control the current supplied to the OLED 130 with fine precision.

In addition, between the data line 14 and the gate node g in the pixel circuit 110 as shown by the dashed lines in FIG. 3, the capacity Cprs has a parasitic effect in practice. For this reason, when the potential change dynamic range of the data line 14 is large, there is propagation to the gate node g through the capacity Cprs and so-called cross-talk, nonuniformity, or the like is generated and the display quality is deteriorated. The influence of the capacity Cprs is remarkably apparent when the pixel circuit 110 is miniaturized.

In contrast, in the present embodiment, since the potential change range of the data line 14 is narrowed with respect to the potential range ΔV data of the data signal, it is possible to limit the influence of the capacity Cprs.

Second Embodiment

In the first embodiment, when the threshold voltage of the transistor 121 is varied in each pixel circuit 110, display nonuniformity impairing the uniformity of the display screen is generated. Next, description will be given of a second embodiment compensating for variations in the threshold voltage of the transistor 121. Here, in the following, in order to avoid repeated description, description will be given focusing on parts which are different to the first embodiment.

Figure 11:
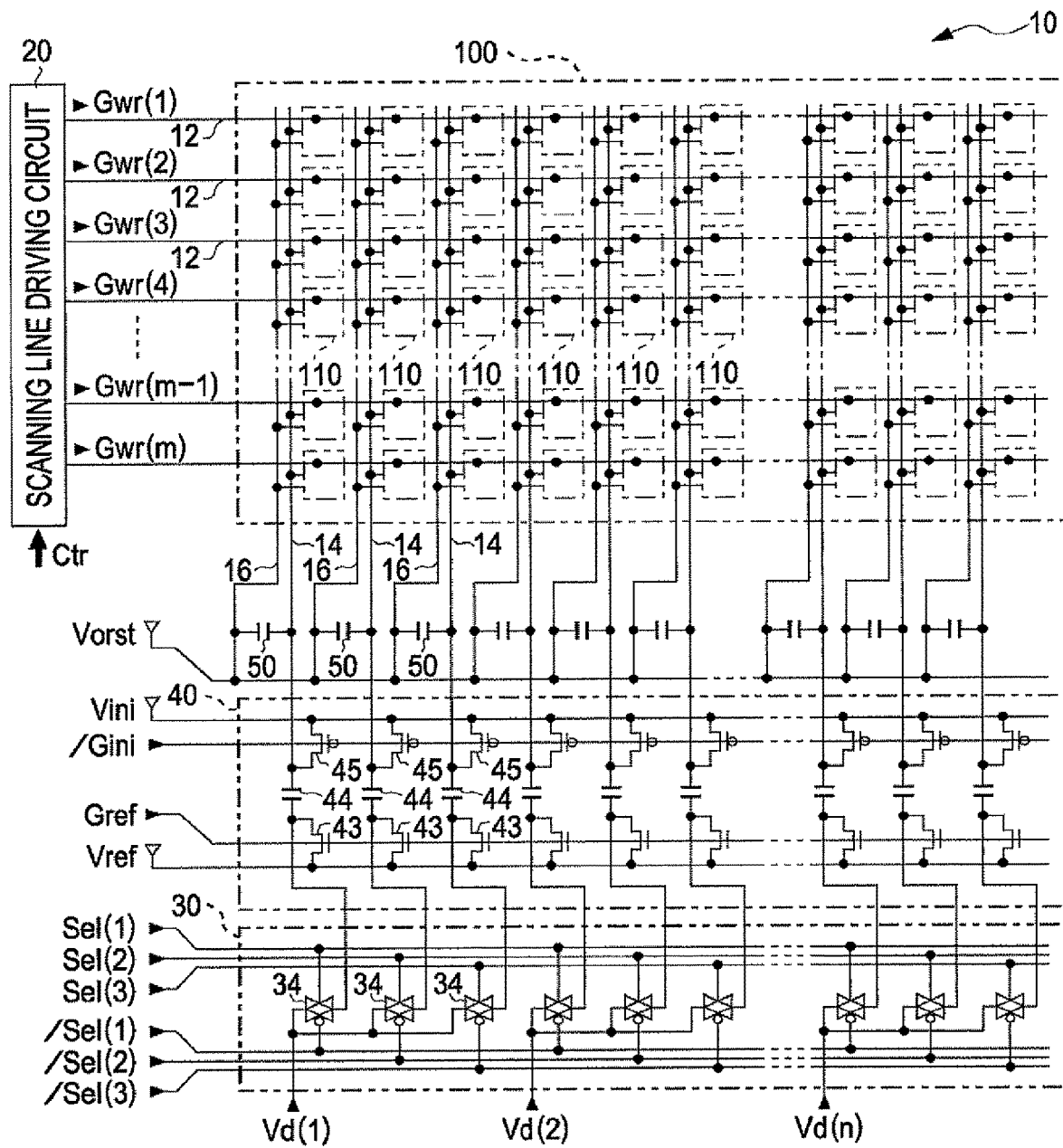
FIG. 11 is a diagram showing a configuration of an electro-optical device according to a second embodiment.

FIG. 11 is a diagram showing a configuration of an electro-optical device 10 according to the second embodiment.

The points where the second embodiment shown in this diagram is different to the first embodiment (refer to FIG. 2) are that, first, feed lines 16 are provided, second, a part of the level shift circuit 40 is different, and third, the configuration and operation of the pixel circuit 110 are different.

First, regarding the first point of difference, the feed lines 16 are respectively provided along the data lines 14 in each column of the display unit 100. A potential Vorst is fed in common to each feed line 16. In addition, the other ends of the holding capacities 50 of each column are respectively connected to the feed lines 16 of the corresponding columns.

Regarding the second point of difference, the transistor 46 in the first embodiment (refer to FIG. 2) is replaced by the transistor 43 in FIG. 11. The control signal Gref is supplied in common across each column from the control circuit 5 to the gate of the transistor 43.

Figure 12:
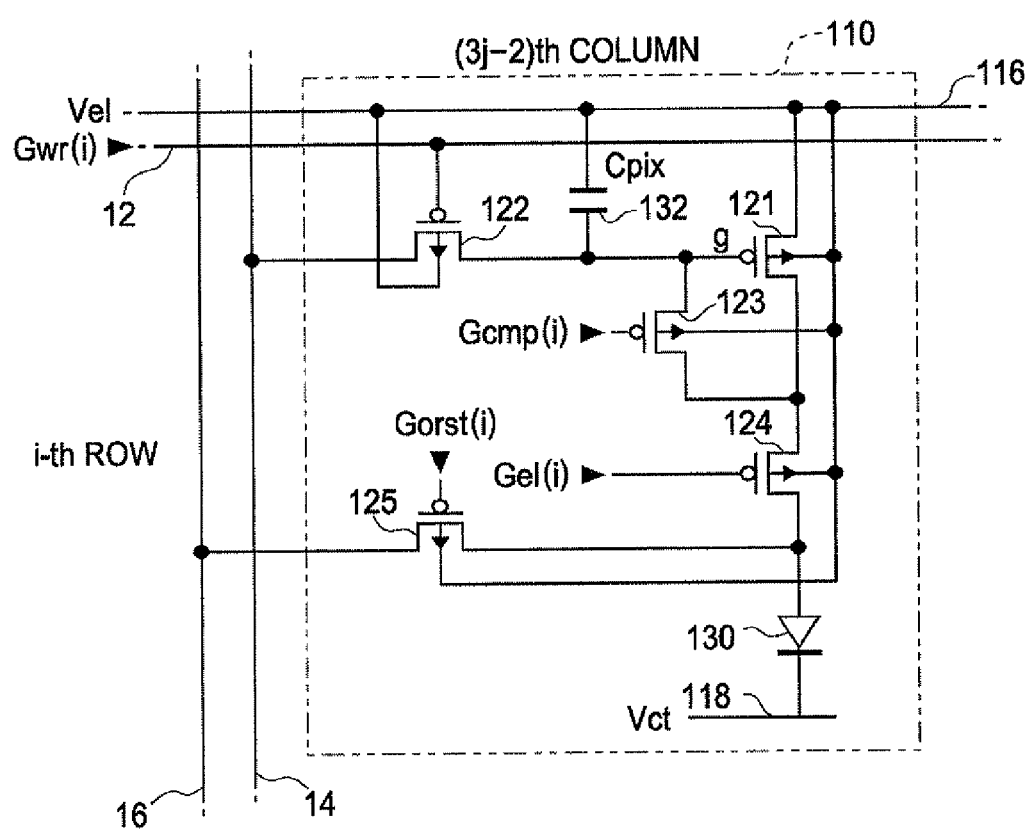
FIG. 12 is a diagram showing a pixel circuit of the electro-optical device.

The third point of difference will be described with reference to FIG. 12. FIG. 12 is a diagram showing a configuration of the pixel circuit 110 of the electro-optical device 10 according to the second embodiment. The point in which the pixel circuit 110 shown in the diagram is different from the circuit configuration shown in FIG. 4 is that P-channel MOS-type transistors 123 and 125 are added.

Here, in the transistor 123, the control signal Gcmp(i) corresponding to the i-th row is supplied to the gate node and the source node is connected to the drain node of the transistor 121. In addition, the drain node of the transistor 123 is connected to the gate node g of the transistor 121.

Meanwhile, in the transistor 125, the control signal Gorst (i) corresponding to the i-th row is supplied to the gate node and the source node is connected to the anode of the OLED 130. In addition, the drain node of the transistor 125 is connected to the feed line 16 of the corresponding column.

Here, the substrate potential of the transistors 123 and 125 is set to the potential Vel in the same manner as the transistors 121, 122, and 14.

Operation Of Second Embodiment

Figure 13:
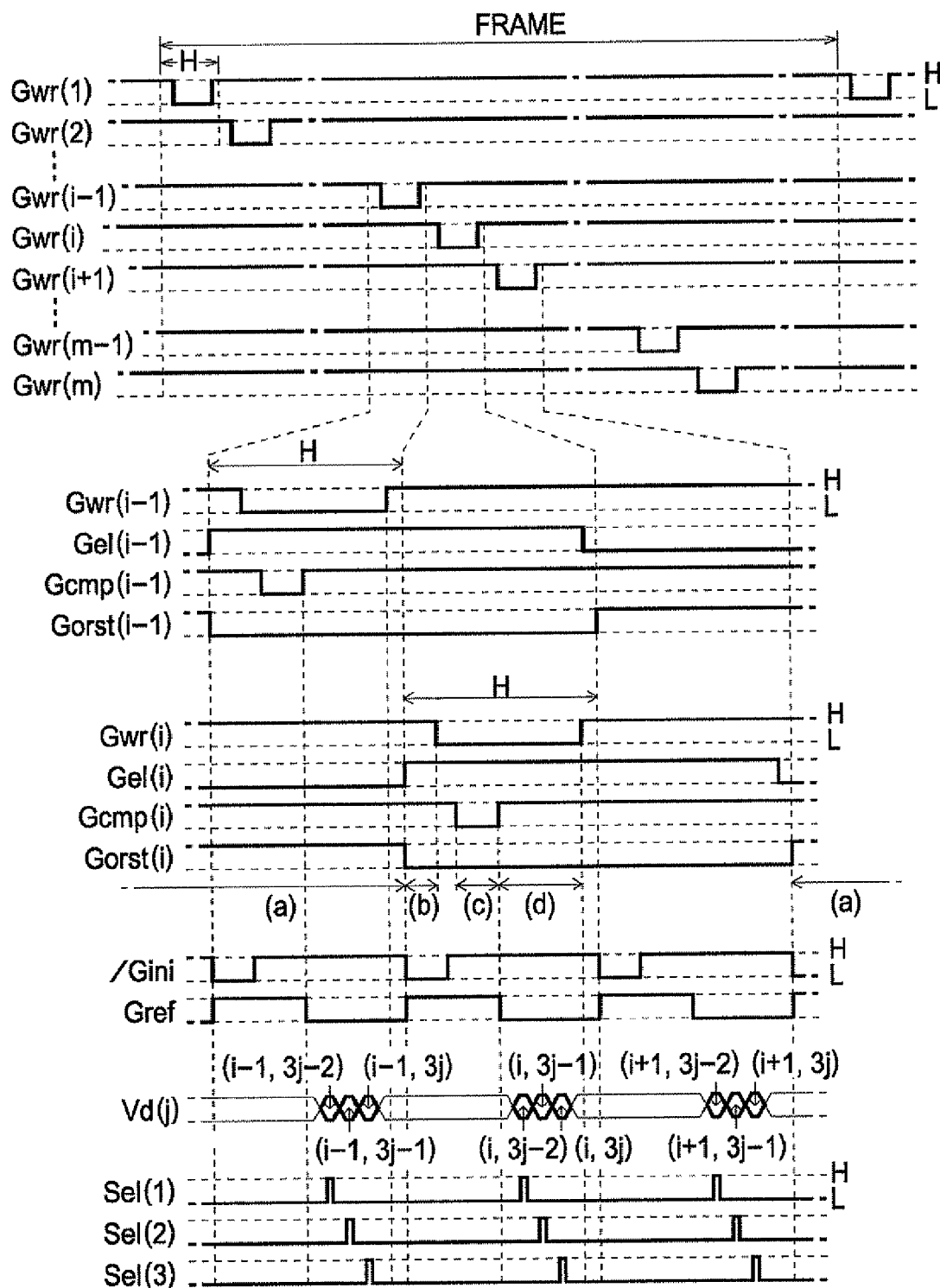
FIG. 13 is a timing chart showing an operation of the electro-optical device.

The operation of the electro-optical device 10 according to the second embodiment will be described with reference to FIG. 13. FIG. 13 is a timing chart for illustrating the operation in the second embodiment.

As shown in the drawings, the point that the scanning signals Gwr(1) to Gwr(m) are sequentially switched to the L level and the scan lines 12 of rows 1 to m are scanned in order for each horizontal scanning period (H) in a period of one frame is the same as the first embodiment. However, in comparison with the first embodiment, in the second embodiment, in the scanning period of the i-th row, a compensation period shown by (c) is inserted between the initialization period shown by (b) and the writing period shown by (d). For this reason, in the second embodiment, with regard to the chronological order, the cycle of (light emitting period)→initialization period→compensation period→writing period→(light emitting period) is repeated.

Light Emitting Period

In the second embodiment, as shown in FIG. 13, in the light emitting period of the i-th row, the scan signal Gwr(i) is the H level. In addition, among the control signals Gel(i), Gcmp(i), and Gorst(i), the control signal Gel(i) is L level, and the control signals Gcmp(i) and Gorst(i) are H level.

Figure 14:
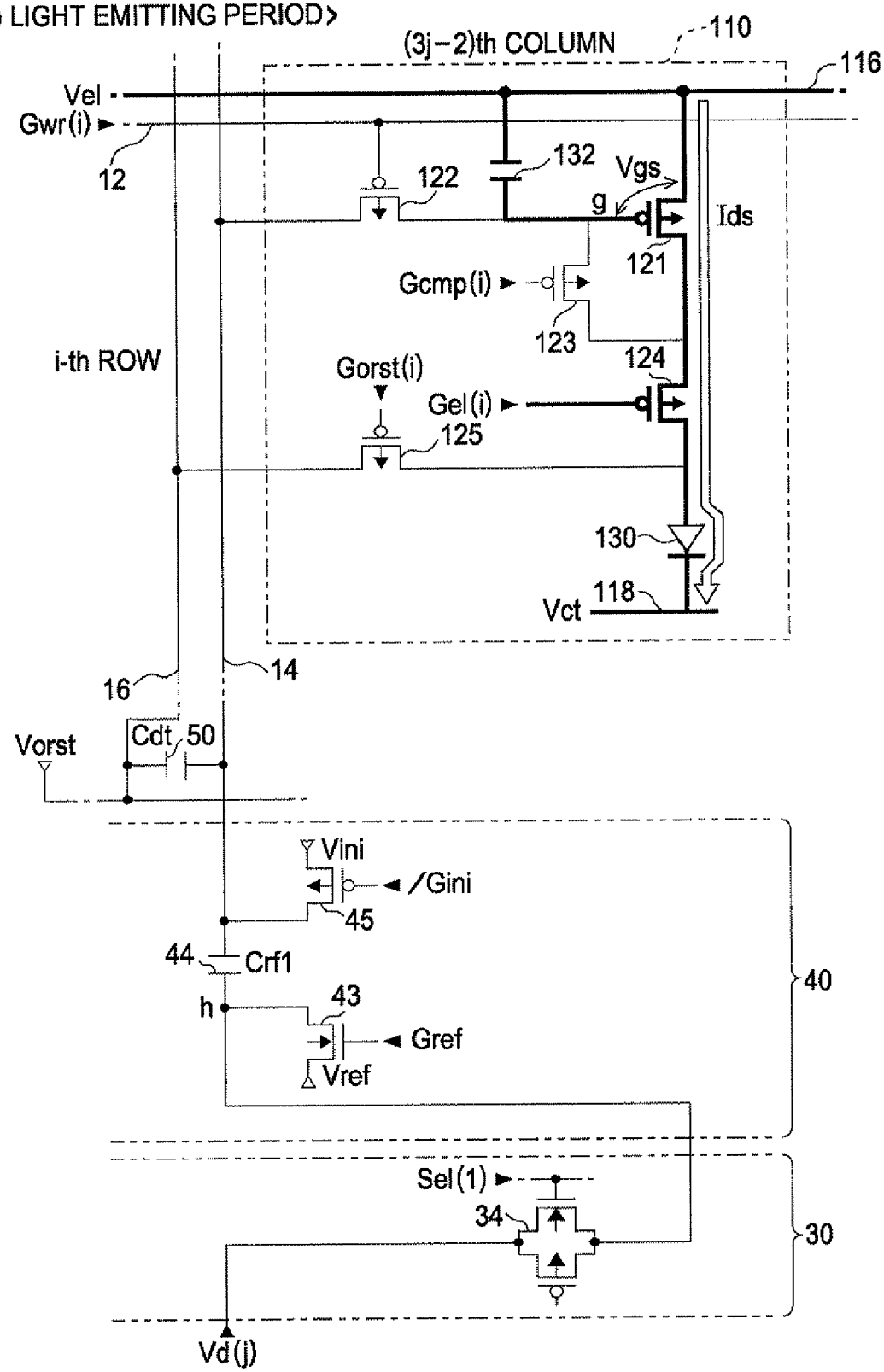
FIG. 14 is an explanatory diagram of an operation of the electro-optical device.

For this reason, in the pixel circuit 110 of the i-th row (3j−2) column as shown in FIG. 14, the transistor 124 is turned on while the transistors 122, 123, and 125 are turned off. Accordingly, the transistor 121 supplies the current Ids according to the voltage Vgs between the gate and source to the OLED 130.

As will be described below, in the second embodiment, the voltage Vgs in the light emitting period is a value level-shifted from the threshold voltage of the transistor 121 according to the potential of the data signal. For this reason, a current according to the gradation level will be supplied to the OLED 130 in a state where the threshold voltage of the transistor 121 is compensated.

Initialization Period

When the scanning period of the i-th row is reached, first, the initialization period of (a) is started. In the initialization period, in contrast to the light emitting period, respective changes are made such that the control signal Gel(i) becomes the H level and the control signal Gorst(i) becomes the L level.

Figure 15:
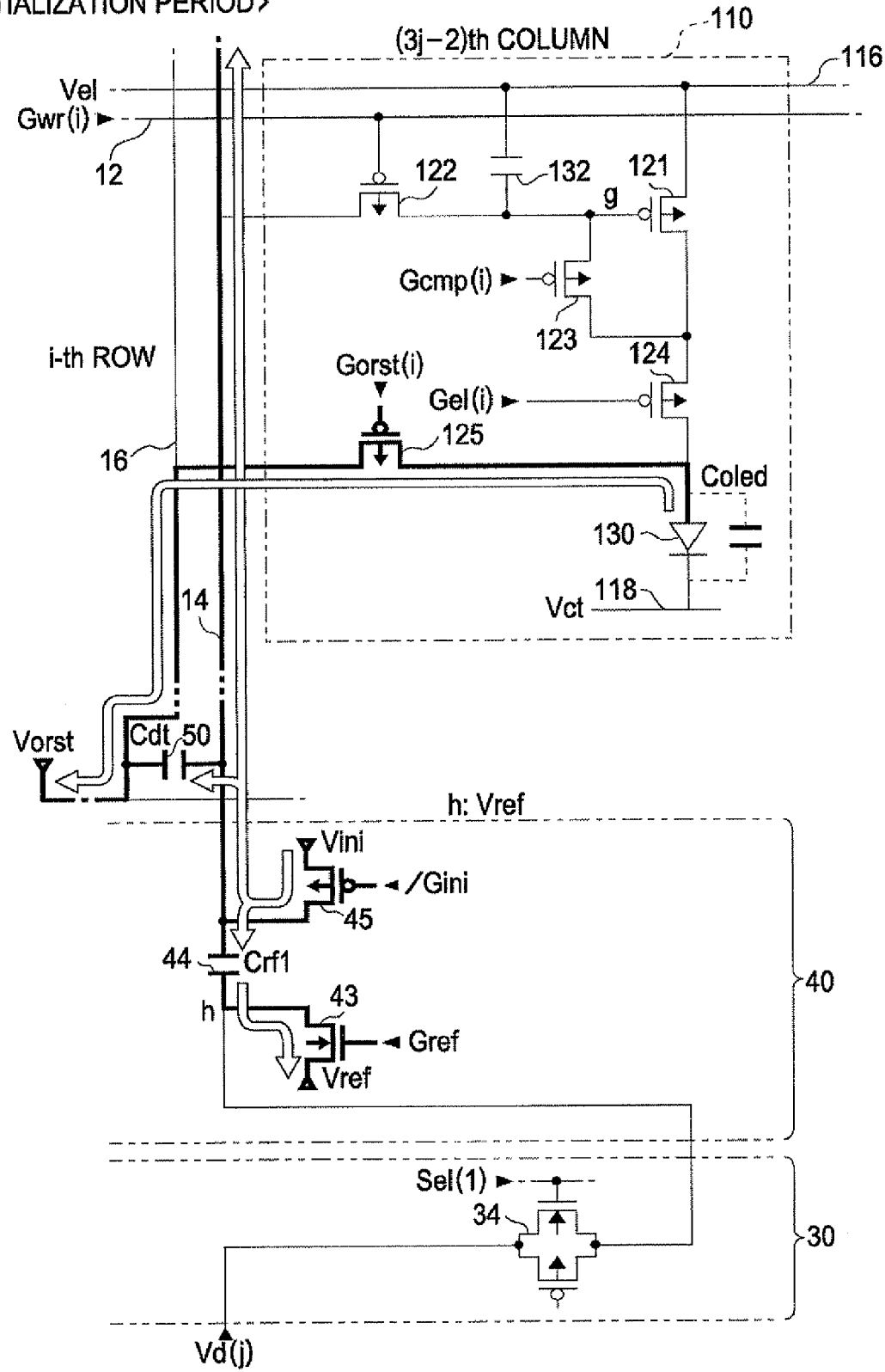
FIG. 15 is an explanatory diagram of an operation of the electro-optical device.

For this reason, in the pixel circuit 110 of the i-th row (3j−2) column as shown in FIG. 15, the transistor 124 is turned off and the transistor 125 is turned on. In this manner, the route of the current supplied to the OLED 130 is interrupted and the anode of the OLED 130 is reset to the potential Vorst.

Since the OLED 130 has a configuration in which an organic layer EL is interposed between the above-described anode and cathode, between the anode and the cathode, the capacity Coled has a parasitic effect in parallel as shown by the dashed line in the diagram in practice. When the current was flowing in the OLED 130 in the light emitting period, the voltage of both ends between the anode and the cathode of the OLED 130 is held by the capacity Coled; however, the holding voltage is reset by the turning on of the transistor 125. For this reason, in the second embodiment, when the current flows again in the OLED 130 in the next light emitting period, influence due to the voltage held by the capacity Coled is less likely.

In detail, for example, when changed from a high-luminance display state to a low-luminance display state, when the configuration in one which is not reset, since the high voltage of the time when the luminance is high (a large current flowed) is held, next, even though it is intended that a small current be made to flow, an excessive current flows and it is not possible to change to a low-luminance display state. In contrast, in the second embodiment, since the potential of the anode of OLED 130 is reset by the turning on of the transistor 125, the reproducibility of the low brightness side can be improved.

Here, in the second embodiment, the potential Vorst is set so that the difference of the potential Vorst and the potential Vct of the common electrodes 118 falls below the light emitting threshold voltage of the OLED 130. For this reason, in the initialization period (compensation period and writing period to be described later), the OLED 130 is in an off (non-light emitting) state.

Meanwhile, since the control signal /Gini becomes the L level and the control signal Gref becomes the H level in the initialization period, in the level shift circuit 40, the transistors 45 and 43 as shown in FIG. 15 are respectively turned on. For this reason, the data line 14 which is one end of the storage capacitor 44 and the node h which is the other end of the storage capacitor 44 are respectively initialized at a potential Vini and a potential Vref.

The potential Vini in the second embodiment is set so that (Vel−Vini) becomes larger than the threshold voltage |Vth| of the transistor 121. In addition, since the transistor 121 is a P-channel type, the threshold voltage Vth set with the potential of the source node as a reference is negative. Therefore, in order to prevent confusion in the description of the high-low relationship, the threshold voltage is represented by the absolute value |Vth| and regulated by magnitude correlation.

Further, the potential Vref in the second embodiment is set to a value such that the potential of the node h in the following writing period is increased with respect to the potential obtainable by the data signals Vd(1) to Vd(n), for example, so as to become lower than the minimum value Vmin.

Compensation Period

The compensation period of (c) is next in the scanning period of the i-th row. In the compensation period, in contrast to the initialization period, the scanning signal Gwr(i) and the control signal Gcmp(i) become the L level. Meanwhile, in the compensation period, the control signal /Gini becomes the H level in a state where the control signal Gref is maintained at the H level.

Figure 16:
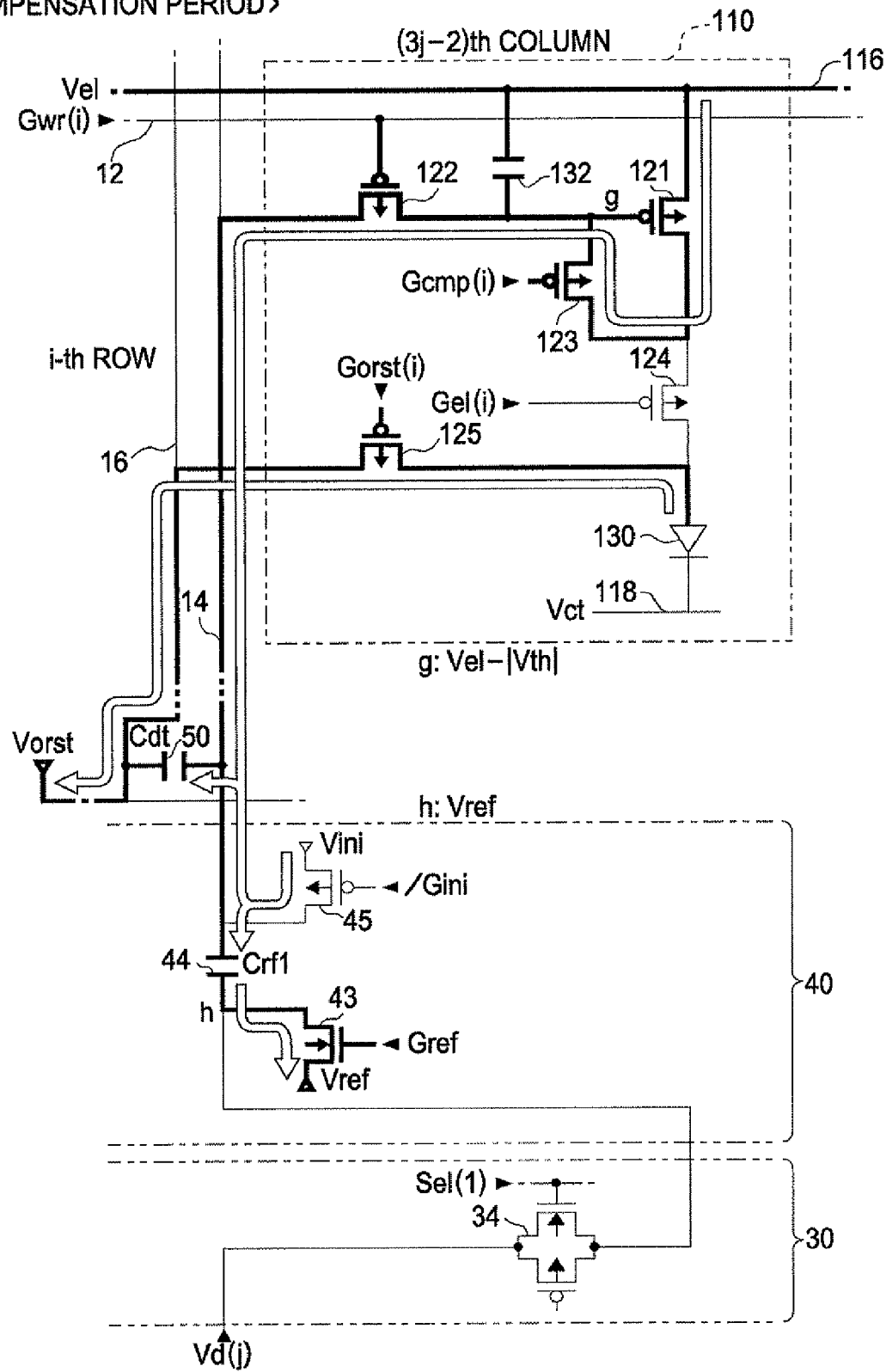
FIG. 16 is an explanatory diagram of an operation of the electro-optical device.

For this reason, as shown in FIG. 16, in the level shift circuit 40, the node h is fixed at a potential Vref by the turning off of the transistor 45 in the state where the transistor 43 is turned on. Meanwhile, since the gate node g is electrically connected to the data lines 14 by the turning on of the transistor 122 in the pixel circuit 110 of the i-th row (3j−2) column, the gate node g becomes the potential Vini at the initial start of the compensation period.

Since the transistor 123 is turned on in the compensation period, the transistor 121 becomes "diode-connected". For this reason, the drain current flows through the transistor 121 to charge the gate node g and the data line 14. In detail, the current flows in a path of the feed line 116→transistor 121→transistor 123→transistor 122→data line 14 of (3j−2) th column. For this reason, the data line 14 and the gate node g mutually connected by the turning on of the transistor 121 are increased from the potential Vini.

However, since the current flowing through the above-described route flows less easily as the gate node g becomes closer to the potential (Vel−|Vth|), the data line 14 and the gate node g are saturated with the potential (Vel−|Vth|) until the compensation period is finished. Accordingly, the storage capacitor 132 holds the threshold voltage |Vth| of the transistor 121 until the compensation period is finished.

Writing Period

Since the control signal Gcmp(i) is the H level when the compensation period is finished, the control signal Gref becomes the L level while the diode-connection of the transistor 121 is ended, whereby the transistor 43 is turned off. For this reason, the route leading up to the gate node g in the pixel circuit 110 of the i-th row (3j−2) column from the data line 14 of the (3j−2)th column is in a floating state; however, the potential in the route is maintained at (Vel−|Vth|) by the holding capacities 50 and 132.

In the writing period of the i-th row, the control circuit 5 sequentially switches the data signal Vd(j) to the potential according to the gradation level of the pixels of the i-th row (3j−2) column, the i-th row (3j−1) column, and the i-th row (3j) column in the j-numbered group. Meanwhile, the control circuit 5 sequentially sets the control signals Sel(1), Sel(2), and Sel(3) in order exclusively to the H level in combination with the switching of the potential of the data signal. In addition, although omitted in FIG. 13, the control circuit 5 performs output for the control signals /Sel(1), /Sel(2), and /Sel(3), which have a logic inverted relationship with the control signals Sel(1), Sel(2), and Sel(3). In this manner, in the demultiplexer 30, the transmission gates 34 are turned on in order of the left end column, the center column, and the right end column respectively in each group.

Figure 17:
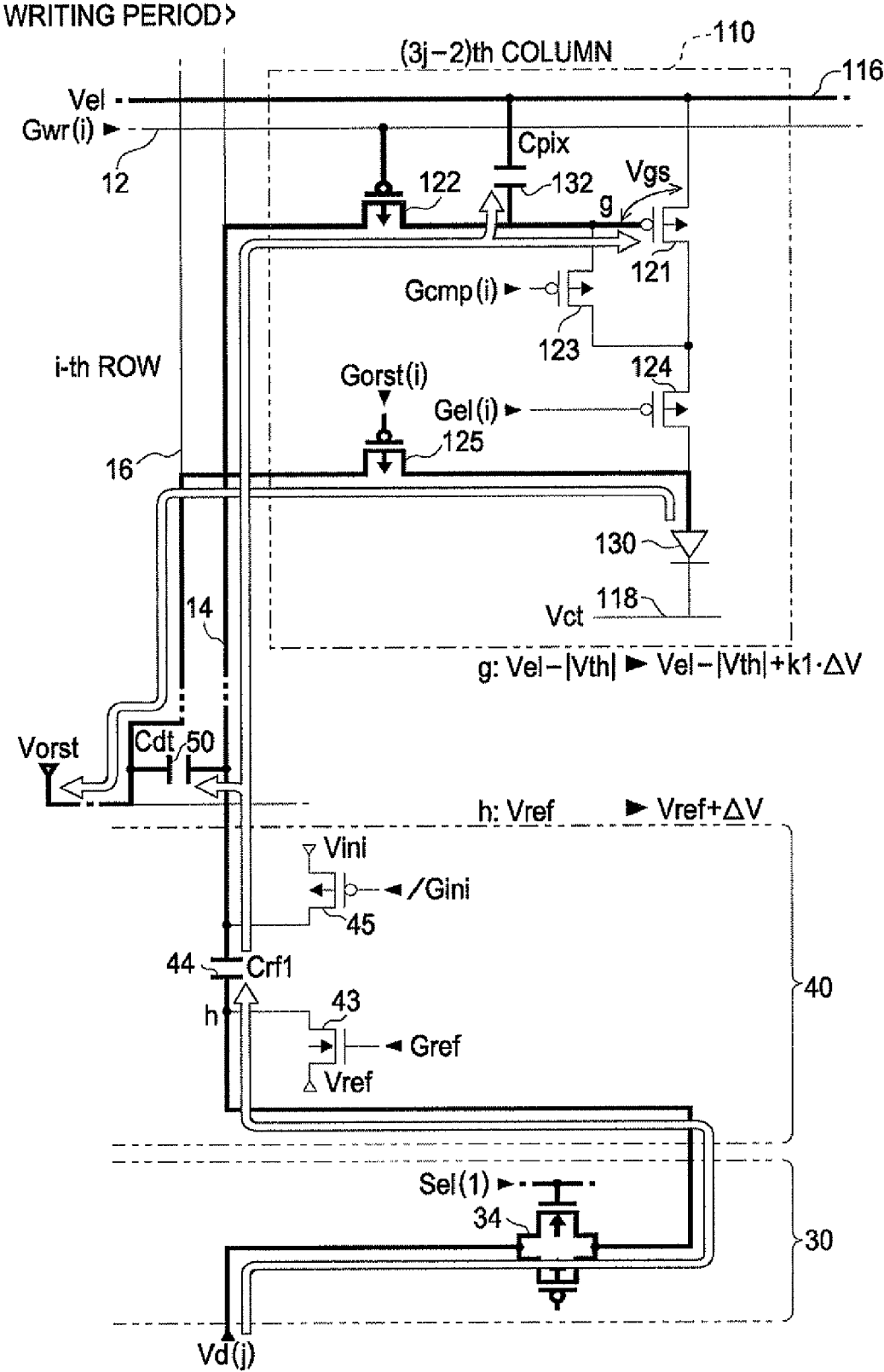
FIG. 17 is an explanatory diagram of an operation of the electro-optical device.

Here, when the transmission gate 34 of the left end column is turned on by the control signals Sel(1) and /Sel(1), as shown in FIG. 17, the node h which is the other end of the storage capacitor 44 is changed to the potential of the data signal Vd(j) from the potential Vref in the initialization period, that is, to the potential (Vref+ΔV) according to the gradation level of the pixels of the i-th row (3j−2) column.

Meanwhile, since the gate node g is connected to one end of the storage capacitor 44 through the data line 14, it becomes a value shifted in an increasing direction from the potential (Vel−|Vth|) in the compensation period by a value in which the capacity ratio k1 is multiplied by the potential change amount ΔV of the node h.

For this reason, the potential of the gate node g becomes a value (Vel−|Vth|+k1·ΔV) shifted in an increasing direction from the potential (Vel−|Vth|) in the compensation period by a value in which the capacity ratio k1 is multiplied by the potential change amount ΔV of the node h. At this time, when expressed as an absolute value by the voltage Vgs of the transistor 121, it becomes a value (|Vth|−k1·ΔV) in which the shift amount of the increase in the potential of the gate node g is subtracted from the threshold voltage |Vth|.

Light Emitting Period

In the second embodiment, after the writing period of the i-th row finishes, there is an interval of one horizontal scanning period leading to the light emitting period. In the light emitting period, since the control signal Gel(i) becomes the L level as described above, in the pixel circuit 110 of the i-th row (3j−2) column, the transistor 124 is turned on. Since the voltage Vgs between the gate and the source is (|Vth|−k1·ΔV)), as shown previously in FIG. 14, a current according to the gradation level will be supplied to the OLED 130 in a state where the threshold voltage of the transistor 121 is compensated.

These kinds of operations are chronologically performed in parallel even in other pixel circuits 110 of the i-th row other than the pixel circuit 110 of the (3j−2)th column in the scanning period of the i-th row. In addition, this operation of the i-th row is performed in order of the 1, 2, 3, . . . , (m−1), m rows in the period of one frame in practice and this is repeated for each frame.

According to the second embodiment, in the same manner as the first embodiment, since the potential range ΔV gate in the gate node g is narrowed with respect to the potential range ΔV data of the data signal, it is possible to apply a voltage reflecting the gradation level between the gate and source of the transistor 121 even without cutting up the data signal with fine precision. For this reason, even in a case where a micro current flowing to the OLED 130 with respect to the voltage Vgs between the gate and the source of the transistor 121 in the miniaturized pixel circuit 110 is changed to a relatively large extent, it is possible to control the current supplied to the OLED 130 with fine precision.

Next, according to the second embodiment, as the period in which the transistor 125 is turned on, that is, the reset period of the OLED 130, since it is possible to ensure a period longer than the scanning period, for example, two horizontal scanning periods in the second embodiment, it is possible to sufficiently initialize the voltage held in the parasitic capacitance of the OLED 130 in the light emitting period.

In addition, according to the second embodiment, the current Ids supplied to the OLED 130 by the transistor 121 cancels the influence of the threshold voltage. For this reason, according to the second embodiment, even when the threshold voltage of the transistor 121 is varied in each pixel circuit 110, since these variations are compensated and current according to the gradation level is supplied to the OLED 130, the generation of display nonuniformity impairing the uniformity of the display screen can be suppressed and high-quality display becomes possible.

Figure 18:
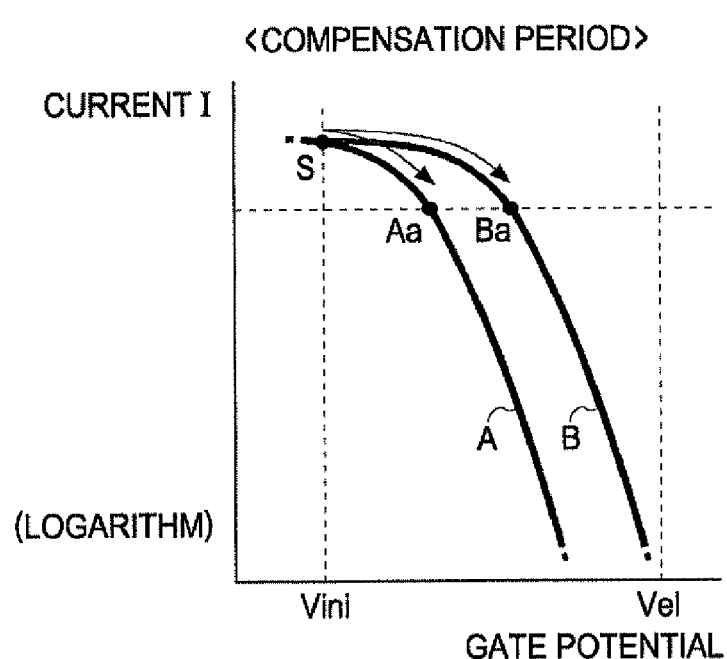
FIG. 18 is a diagram showing the characteristics of a transistor in the electro-optical device.
Figure 18:
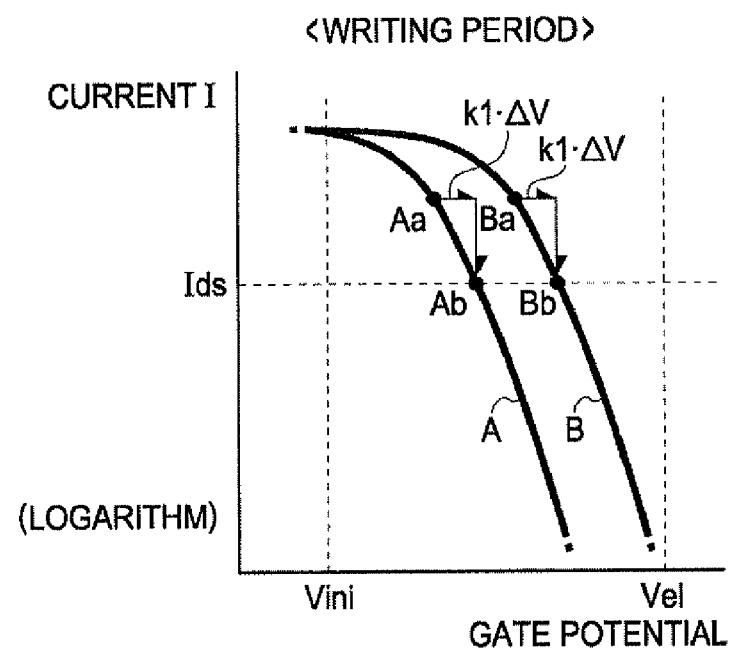

Description will be given of this cancellation with reference to FIG. 18. As shown in this diagram, in order to control the micro current supplied to the OLED 130, transistor 121 operates in a weak inversion region (sub-threshold region).

In the diagram, A and B respectively show the transistor in which the threshold voltage |Vth| is large and the transistor in which the threshold voltage |Vth| is small. Here, in FIG. 18, the voltage Vgs between the gate and the source is the difference between the characteristic shown by the solid line and the potential Vel. Further, in FIG. 18, the current of the vertical scale is shown by a logarithm in which the direction from the source to the drain is set to positive (up).

In the compensation period, the gate node g becomes a potential (Vel−|Vth|) from the potential Vini. For this reason, on one hand, for the transistor A in which the threshold voltage |Vth| is large, the operation point moves from S to Aa, while for the transistor B in which the threshold voltage |Vth| is small, the operation point moves from S to Ba.

Next, in a case where the potentials of the data signals to the pixel circuit 110 to which the two transistors belong are the same, in other words, in a case where the same gradation level is specified, the potential shift amount from the operation points Aa and Ba in the writing period are k1·ΔV, which is the same for both. For this reason, for the transistor A, the operation point moves from Aa to Ab and for the transistor B, the operation point moves from Ba to Bb; however, the current in the operation point after the potential shift is matched at almost the same Ids for both of the transistors A and B.

Third Embodiment

In the second embodiment, a configuration is adopted in which the data signals are directly supplied to the other ends of the holding capacities 44 of each column, that is, to the node h by the demultiplexer 30. For this reason, in the scanning period of each row, since the writing period is equal to the period in which the data signals are supplied from the control circuit 5, the time constraint is great.

Next, description will be given of a third embodiment in which it is possible to relax this time constraint. Here, in the following, in order to avoid repeated description, description will be given focusing on parts which are different to the second embodiment.

Figure 19:
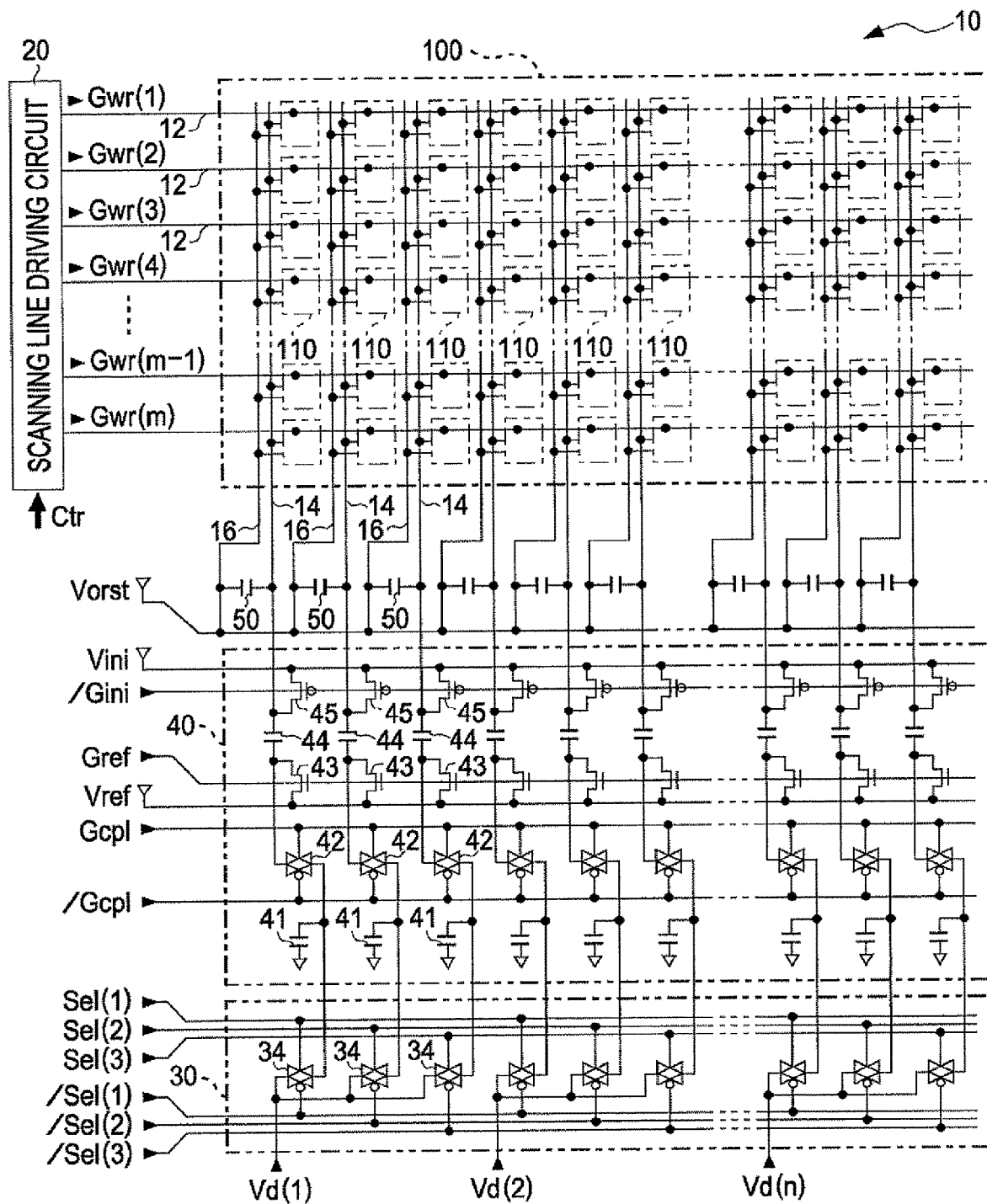
FIG. 19 is a diagram showing a configuration of an electro-optical device according to a third embodiment.

FIG. 19 is a diagram showing a configuration of an electro-optical device 10 according to the third embodiment.

The point in which the third embodiment shown in the diagram is different from the second embodiment shown in FIG. 11 is mainly that holding capacities 41 and transmission gates 42 are provided in each column of the level shift circuit 40.

In detail, the transmission gates 42 in each column are electrically interposed between the output ends of the transmission gates 34 and the other ends of the holding capacities 44. That is, the input ends of the transmission gates 42 are connected to the output ends of the transmission gates 34 and the output ends of the transmission gates 42 are connected to the other ends of the holding capacities 44.

Here, the transmission gates 42 of each column are turned on in unison when the control signal Gcpl supplied from the control circuit 5 is the H level (when the control signal /Gcpl is the L level).

In addition, one end of the storage capacitor 41 in each column is connected to the output end (input end of the transmission gate 42) of the transmission gate 34, and the other end of the storage capacitor 41, for example, is grounded in common to fixed potential, for example, a potential Vss. Although not shown in FIG. 19, the holding capacitance of the storage capacitor 41 is set to Crf2.

Operation of Third Embodiment

Figure 20:
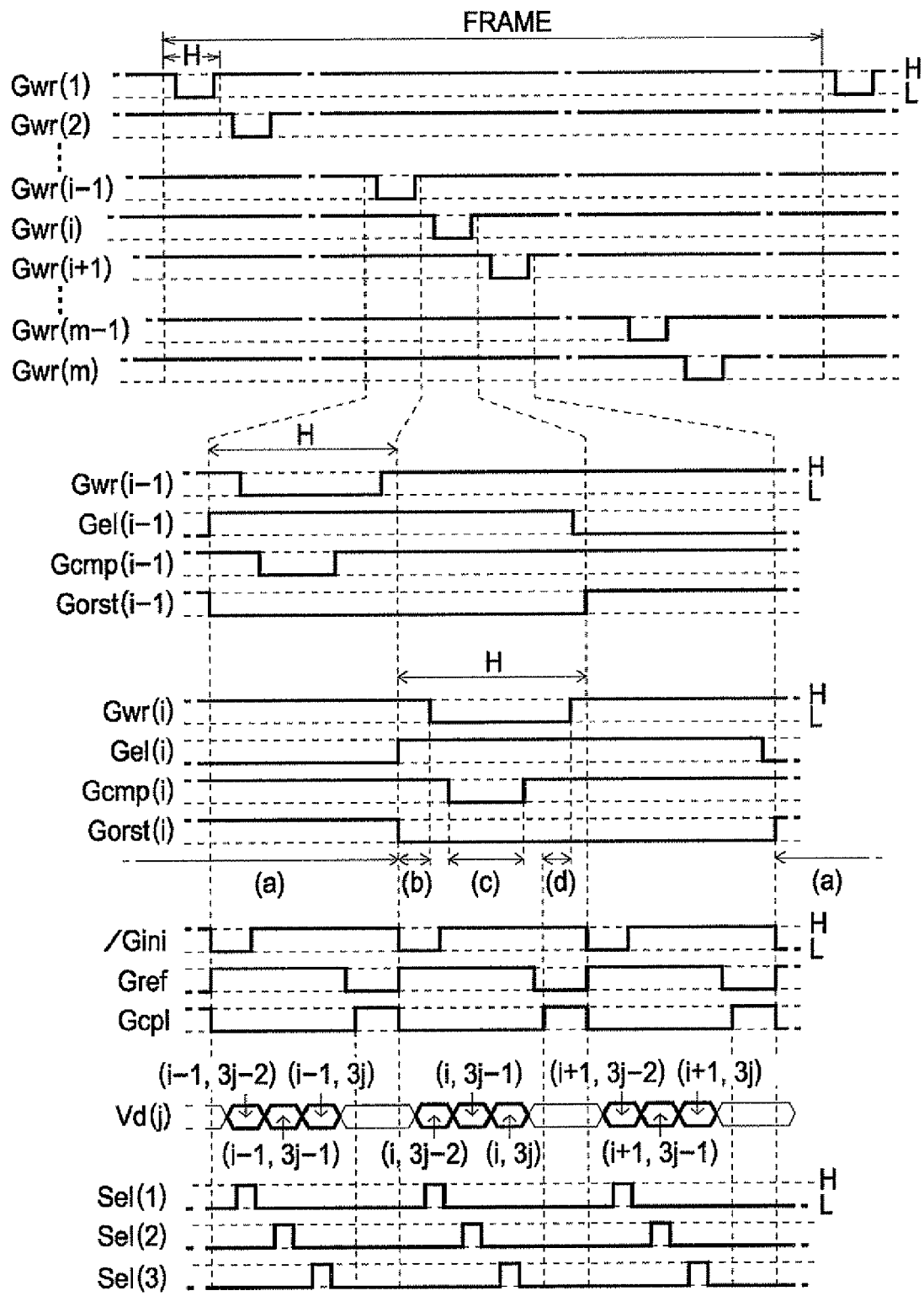
FIG. 20 is a timing chart showing an operation of the electro-optical device.

The operation of the electro-optical device 10 according to the third embodiment will be described with reference to FIG. 20. FIG. 20 is a timing chart for illustrating the operation in the third embodiment.

As shown in the drawings, the point that the scanning signals Gwr(1) to Gwr(m) are sequentially switched to the L level and the scan lines 12 of rows 1 to m are scanned in order for each horizontal scanning period (H) in a period of one frame is the same as the second embodiment. In addition, in the third embodiment, the point that the scanning period of the i-th row is made of an initialization period shown by (b), a compensation period shown by (c), and a writing period shown by (d) is also the same as the second embodiment. Here, the writing period of (d) in the third embodiment is a period from the time the control signal Gcpl changes from the L to the H level (when the control signal /Gcpl has become the L level) until the time the scanning signal changes from the L to the H level.

In the third embodiment, similarly to the second embodiment, with regard to the chronological order, the cycle of (light emitting period)→initialization period→compensation period→writing period→(light emitting period) is repeated. However, the third embodiment is different to the second embodiment in the point that the writing period is not equal to the supply period of the data signal and the supplying of the data signal precedes the writing period. More specifically, the third embodiment is different from the second embodiment in the point that the data signal can be supplied over the initialization period of (a) and the compensation period of (b).

Light Emitting Period

In the third embodiment, as shown in FIG. 20, in the light emitting period of the i-th row, the scan signal Gwr(i) is the H level and, furthermore, the control signal Gel(i) is the L level and the control signals Gcmp(i) and Gorst(i) are H level.

Figure 21:
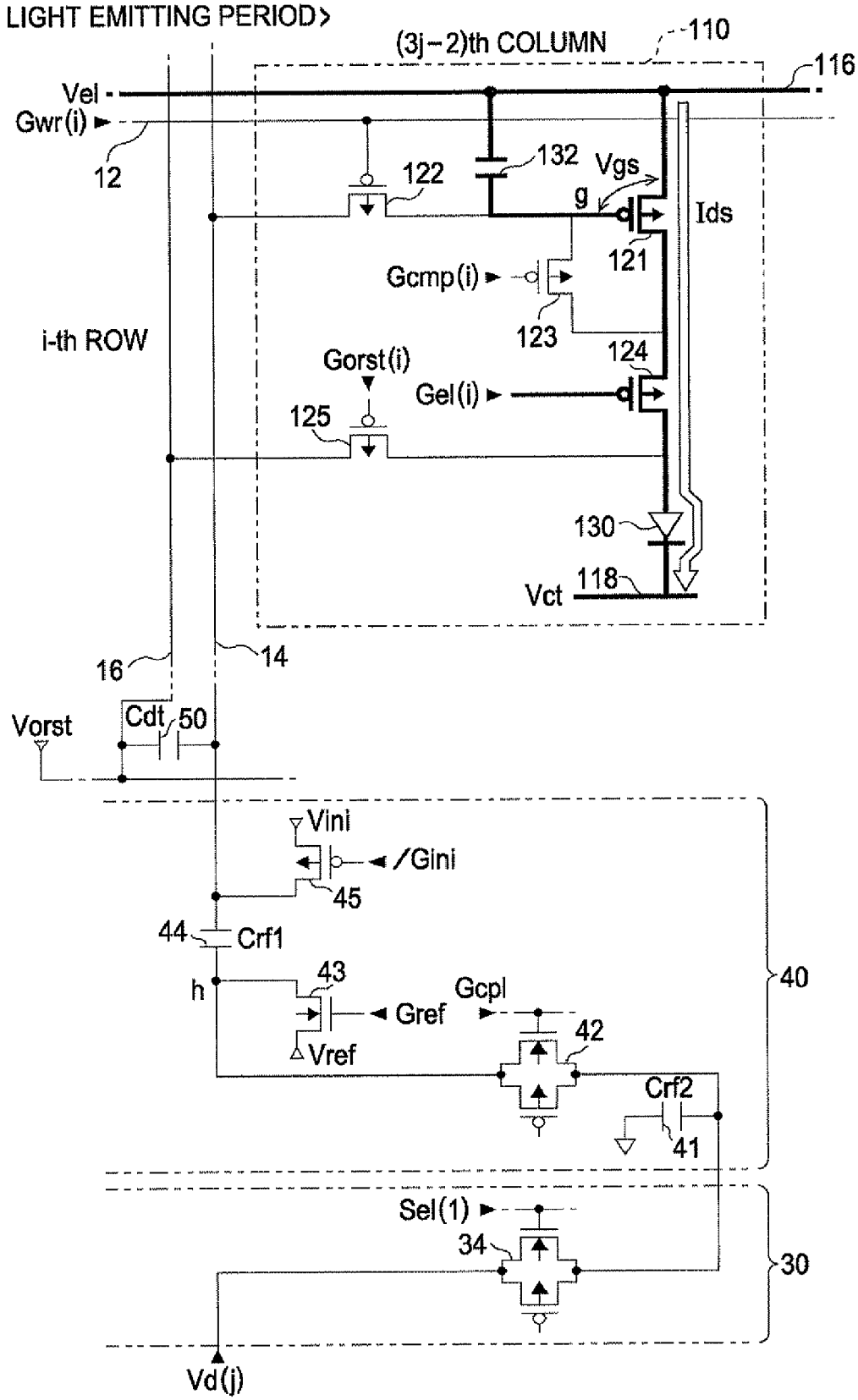
FIG. 21 is an explanatory diagram of an operation of the electro-optical device.

For this reason, in the pixel circuit 110 of the i-th row (3j−2) column as shown in FIG. 21, since the transistor 124 is turned on while the transistors 122, 123, and 125 are turned off, the operation in the pixel circuit 110 is basically the same as the second embodiment. That is, the transistor 121 supplies the current Ids according to the voltage Vgs between the gate and source to the OLED 130.

Initialization Period

When the scanning period of the i-th row is reached, first, the initialization period of (b) is started.

In the initialization period in the third embodiment, in contrast to the light emitting period, respective changes are made such that the control signal Gel(i) becomes the H level and the control signal Gorst(i) becomes the L level.

Figure 22:
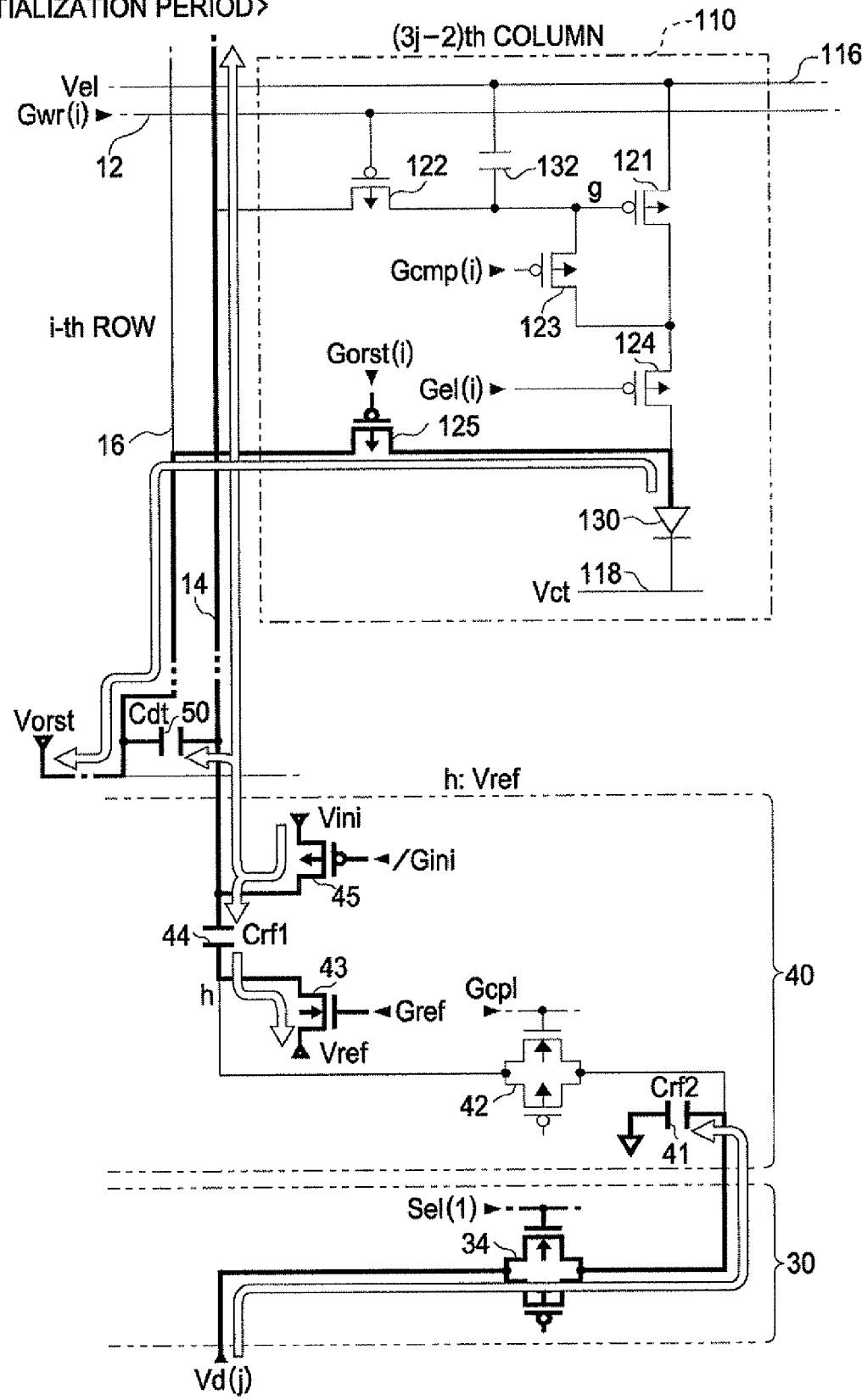
FIG. 22 is an explanatory diagram of an operation of the electro-optical device.

For this reason, in the pixel circuit 110 of the i-th row (3j−2) column as shown in FIG. 22, the transistor 124 is turned off and the transistor 125 is turned on. In this manner, since the route of the current supplied to the OLED 130 is interrupted and the anode of the OLED 130 is reset to the potential Vorst by the turning on of the transistor 124, the operation in the pixel circuit 110 is basically the same as the second embodiment.

Meanwhile, in the initialization period in the third embodiment, the control signal /Gini becomes the L level, the control signal Gref becomes the H level, and the control signal Gcpl becomes the L level. For this reason, in the level shift circuit 40, the transistors 45 and 43 are respectively turned on as shown in FIG. 22 and the transmission gate 42 is turned off. Accordingly, the data line 14 which is one end of the storage capacitor 44 and the node h which is the other end of the storage capacitor 44 are respectively initialized at a potential Vini and a potential Vref.

In the third embodiment, similarly to the second embodiment, the potential Vref is set to a value such that the potential of the node h in the following writing period is increased with respect to the potential obtainable by the data signals Vd(1) to Vd(n).

As described above, the control circuit 5 in the third embodiment supplies the data signals over the initialization period and the compensation period. In other words, the control circuit 5 sequentially switches the data signal Vd(j) to the potential according to the gradation level of the pixels of the i-th row (3j−2) column, the i-th row (3j−1) column, and the i-th row (3j) column in the j-numbered group and, while doing so, sets the control signals Sel(1), Sel(2), and Sel(3) in order exclusively to the H level in combination with the switching of the potential of the data signal. In this manner, in the demultiplexer 30, the transmission gates 34 are turned on in order of the left end column, the center column, and the right end column respectively in each group.

Here, in the initialization period, when the transmission gate 34 of the left end column belonging to the j-numbered group is turned on by the control signals Sel(1), as shown in FIG. 22, since the data signal Vd(j) is supplied to one end of the storage capacitor 41, the data signal is held by the storage capacitor 41.

Compensation Period

The compensation period of (c) is next in the scanning period of the i-th row. In the compensation period in the third embodiment, in contrast to the initialization period, respective changes are made such that the control signal Gwr(i) becomes the L level and the control signal Gcmp(i) becomes the L level.

Figure 23:
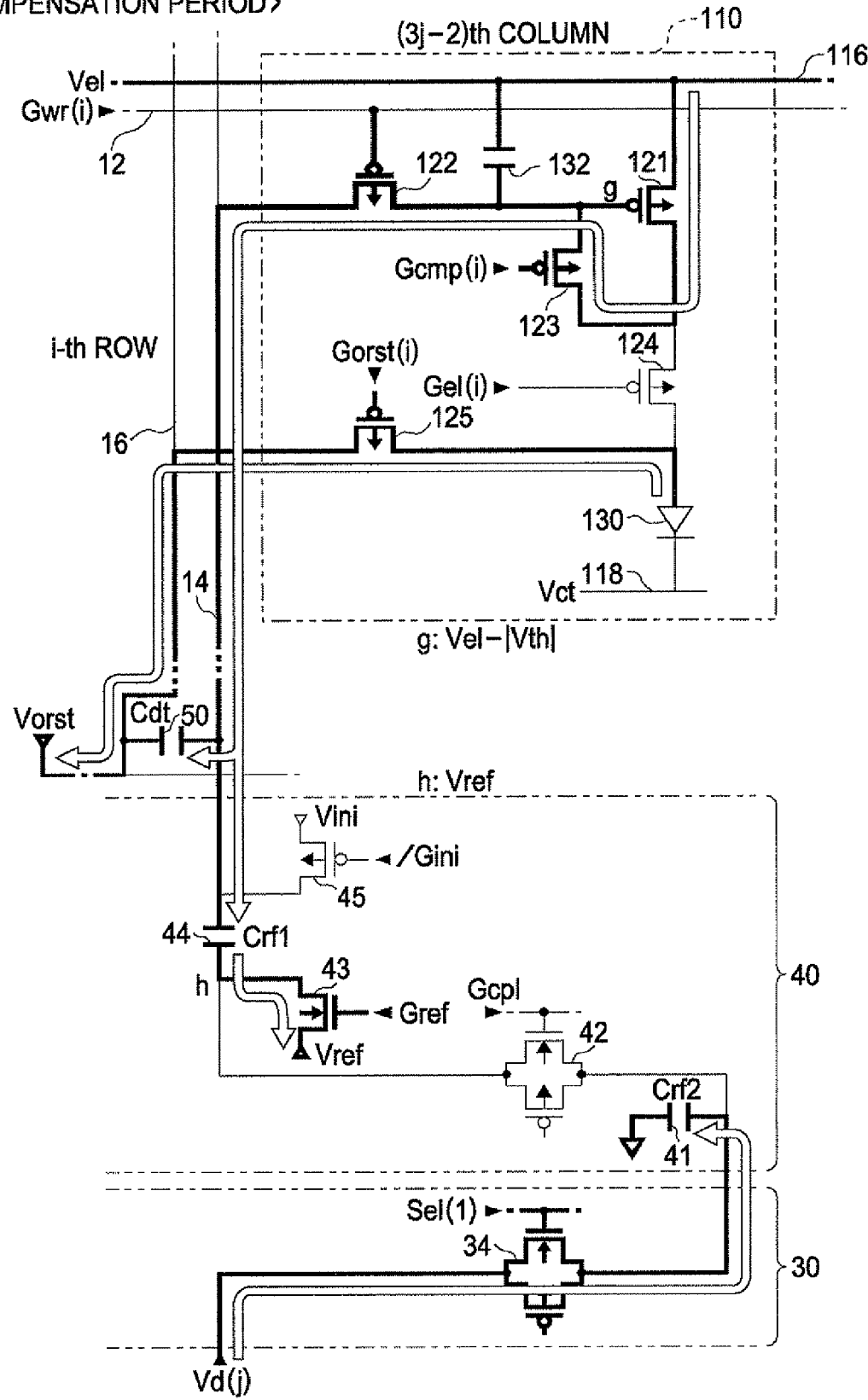
FIG. 23 is an explanatory diagram of an operation of the electro-optical device.

For this reason, while the transistor 122 is turned on in the pixel circuit 110 of the i-th row (3j−2) column as shown in FIG. 23 and the gate node g is electrically connected to the data line 14, the transistor 121 becomes "diode-connected" due to the turning on of the transistor 123.

Accordingly, since the current flows in a path of the feed line 116→transistor 121→transistor 123→transistor 122→data line 14 of (3j−2)th column, the gate node g increases from the potential Vini and, after a short time, is saturated at (Vel−|Vth|). Accordingly, in the third embodiment, the storage capacitor 132 holds the threshold voltage |Vth| of the transistor 121 until the compensation period is finished.

In the third embodiment, in the compensation period, since the control signal /Gini becomes the H level in a state where the control signal Gref is maintained at the H level, the node h in the level shift circuit 40 is fixed at the potential Vref.

Further, in the compensation period, when the transmission gate 34 of the left end column belonging to the j-numbered group is turned on by the control signals Sel(1), as shown in FIG. 23, the data signal Vd(j) is held by the storage capacitor 41.

Here, when the transmission gate 34 of the left end column belonging to the j-numbered group is already turned on by the control signals Sel(1) in the initialization period, the transmission gate 34 is not turned on in the compensation period; however, there is no change in the point that the data signal Vd(j) is held by the storage capacitor 41.

Further, since the control signal Gcmp(i) is the H level when the compensation period is finished, the diode-connection of the transistor 121 is ended.

In the third embodiment, since the control signal Gref becomes the L level in the time from the finishing of the compensation period to the start of the next writing period, the transistor 43 is turned off. For this reason, the route leading up to the gate node g in the pixel circuit 110 of the i-th row (3j−2) column from the data line 14 of the (3j−2) column is in a floating state; however, the potential in the route is maintained at (Vel−|Vth|) by the holding capacities 50 and 132.

Writing Period

Figure 24:
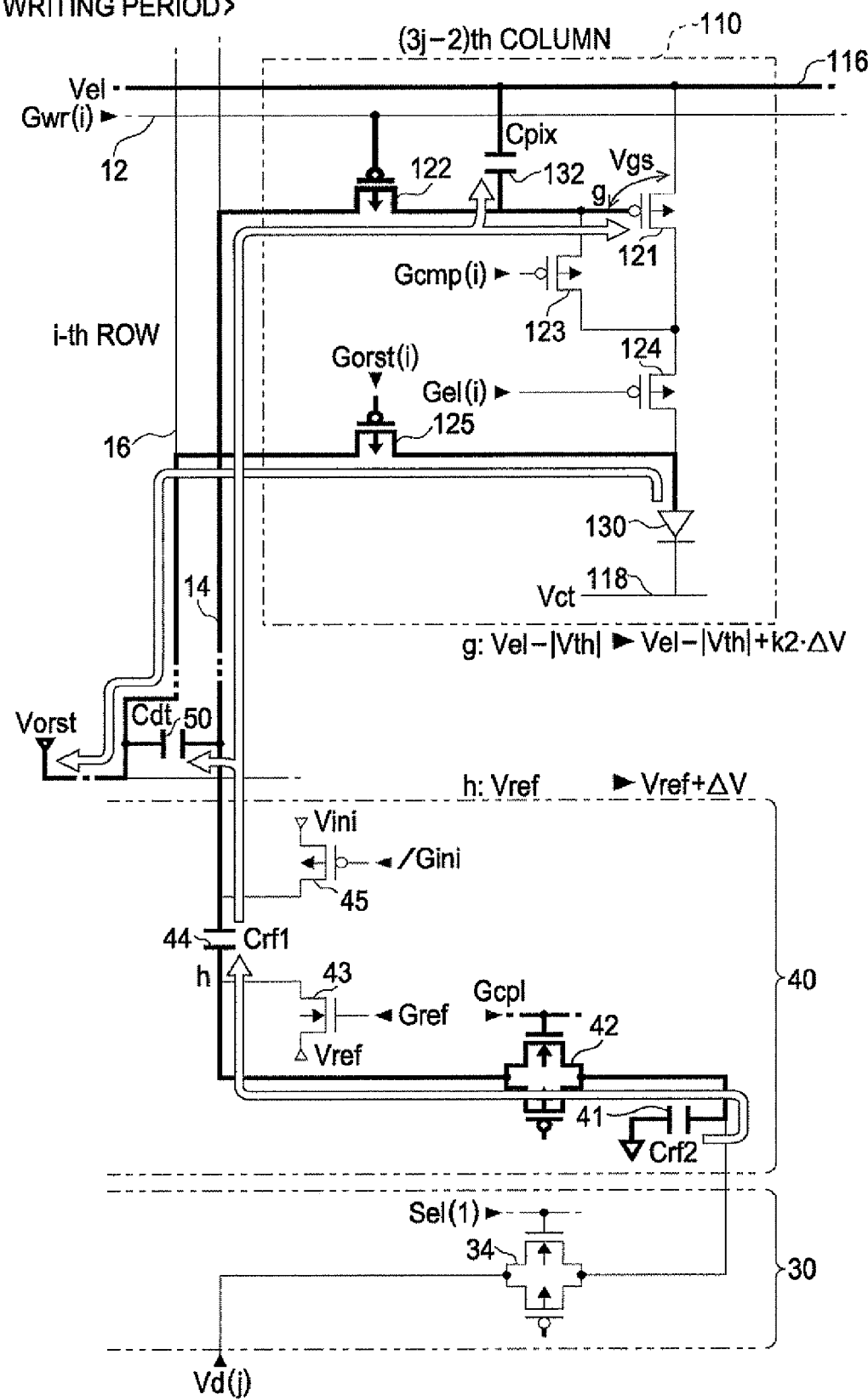
FIG. 24 is an explanatory diagram of an operation of the electro-optical device.

In the writing period in the third embodiment, the control signal Gcpl becomes the L level (the control signal /Gcpl becomes the L level). For this reason, as shown in FIG. 24, since the transmission gate 42 is turned on in the level shift circuit 40, the data signal held in the storage capacitor 41 is supplied to the node h which is the other end of the storage capacitor 44. For this reason, the node h changes to the potential (Vref+ΔV) from the potential Vref in the compensation period.

Meanwhile, since the gate node g is connected to one end of the storage capacitor 44 through the data line 14, it becomes a value shifted in an increasing direction from the potential (Vel−|Vth|) in the compensation period by a value in which the capacity ratio k2 is multiplied by the potential change amount ΔV of the node h. That is, the potential of the gate node g becomes a value (Vel−|Vth|+k2·ΔV) shifted in an increasing direction from the potential (Vel−|Vth|) in the compensation period by a value in which the capacity ratio k2 is multiplied by the potential change amount ΔV of the node h.

Here, the capacity ratio k2 is the capacity ratio of Cdt, Crf1, and Crf2. As described above, the capacity Cpix of the storage capacitor 132 has been ignored.

Further, for instance, the potential Vref in the second embodiment is set to a value such that the potential of the node h in the following writing period is increased with respect to the potential obtainable by the data signals Vd(1) to Vd(n), for example, so as to become lower than the minimum value Vmin.

Further, at this time, when expressed as an absolute value by the voltage Vgs of the transistor 121, it becomes a value (|Vth|−k2·ΔV) in which the shift amount of the increase in the potential of the gate node g is subtracted from the threshold voltage |Vth|.

Light Emitting Period

In the third embodiment, after the writing period of the i-th row finishes, there is an interval of one horizontal scanning period leading to the light emitting period. In the light emitting period, since the control signal Gel(i) becomes the L level as described above, in the pixel circuit 110 of the i-th row (3j−2) column, the transistor 124 is turned on.

The voltage Vgs between the gate and the source is (|Vth|−k2·ΔV) and is a value level-shifted from the threshold voltage of the transistor 121 according to the potential of the data signal. For this reason, as shown in FIG. 21, a current according to the gradation level will be supplied to the OLED 130 in a state where the threshold voltage of the transistor 121 is compensated.

These kinds of operations are chronologically performed in parallel even in other pixel circuits 110 of the i-th row other than the pixel circuit 110 of the (3j−2)th column in the scanning period of the i-th row. In addition, this operation of the i-th row is performed in order of the 1, 2, 3, . . . , (m−1), m rows in the period of one frame in practice and this is repeated for each frame.

According to the third embodiment, similar to the first embodiment and the second embodiment, even in a case where a micro current flowing to the OLED 130 with respect to the voltage Vgs between the gate and the source of the transistor 121 in the miniaturized pixel circuit 110 is changed to a relatively large extent, it is possible to control the current supplied to the OLED 130 with fine precision.

According to the third embodiment, similar to the second embodiment, as well as being able to sufficiently initialize the voltage held by the parasitic capacitance of the OLED 130 in the light emitting period, the generation of display nonuniformity impairing the uniformity of the display screen can be suppressed even when the threshold voltage of the transistor 121 is varied in each pixel circuit 110, and, as a result, high-quality display becomes possible.

According to the third embodiment, the operation of holding the data signal supplied through the demultiplexer 30 from the control circuit 5 in the storage capacitor 41 is performed from the initialization period to the compensation period. For this reason, it is possible to relax the time constraints on the operation to be performed in one horizontal scanning period.

For example, since the current flowing in the transistor 121 decreases as the voltage Vgs between the gate and the source in the compensation period approaches the threshold voltage, time is needed for the gate nodes g to converge at the potential (Vel−|Vth|); however, in the third embodiment, it is possible to ensure a long compensation period as shown in FIG. 20 in comparison with the second embodiment. For this reason, according to the third embodiment, in comparison with the second embodiment, it is possible to compensate for the variation of the threshold voltage of transistor 121 with fine precision.

In addition, it is possible to slow down the supply operation of the data signals.

Application and Modification Examples

The invention is not limited to the embodiments described above or the embodiments and the like of application examples, and, for example, various kinds of modifications as described below are possible. In addition, the forms of the modifications described below can be arbitrarily selected or a plurality thereof can be combined.

Control Circuit

In the embodiments, the control circuit 5 for supplying a data signal is separate from the electro-optical device 10; however, the control circuit 5 may be integrated into the silicon substrate along with the scanning line driving circuit 20, the demultiplexer 30, and the level shift circuit 40.

Substrate

In the embodiments, a configuration was adopted in which the electro-optical device 10 was integrated with a silicon substrate; however, a configuration of being integrated with another silicon substrate may be adopted. Further, the forming may be made in a glass substrate or the like by the application of a polysilicon process. In any case, a configuration in which the pixel circuit 110 is miniaturized and the drain current is exponentially large with respect to changes in gate voltage Vgs in the transistor 121 is effective.

Demultiplexer

In these embodiments, a configuration was adopted in which the data lines 14 are grouped every three columns, the data lines 14 are selected in order in each group, and the data signals are supplied; however, the number of data lines configuring a group may be "2", or may be "4" or more.

In addition, a configuration may be adopted in which grouping is not performed, that is, in which the data signals are supplied in unison line-sequentially to the data lines 14 of each column without using the demultiplexer 30. Here, in the first embodiment, in the case of a configuration in which the data signals are supplied in unison line-sequentially to the data lines 14 of each column without using the demultiplexer 30, the node h, which is the other end of the storage capacitor 44 is connected to the output end in the data signal output circuit (control circuit 5). Since the node h becomes the ground level in a period when the data signal is not output when the output impedance of the data signal output circuit is low, this can be used as the initial potential.

Channel Type of Transistor

In the embodiments such as described above, the transistors 121 to 125 in the pixel circuit 110 were standardized as P-channel type; however, they may be standardized as N-channel type. Further, the P-channel type and N-channel type may be suitably combined.

Other

In embodiments such as these, an OLED, which is a light emitting element was exemplified as an electro-optical element; however, for example, it is sufficient if light is emitted with a luminance corresponding to the current, such as by an inorganic light emitting diode or an LED (Light Emitting Diode).

Electronic Equipment

Next, description will be given of the electronic apparatus in which the electro-optical device 10 according to the embodiments and application examples is applied. The electro-optical device 10 is designed for use in high-definition displays with small-size pixels. Therefore, description will be given with a head-mounted display as an example of the electronic apparatus.

Figure 25:
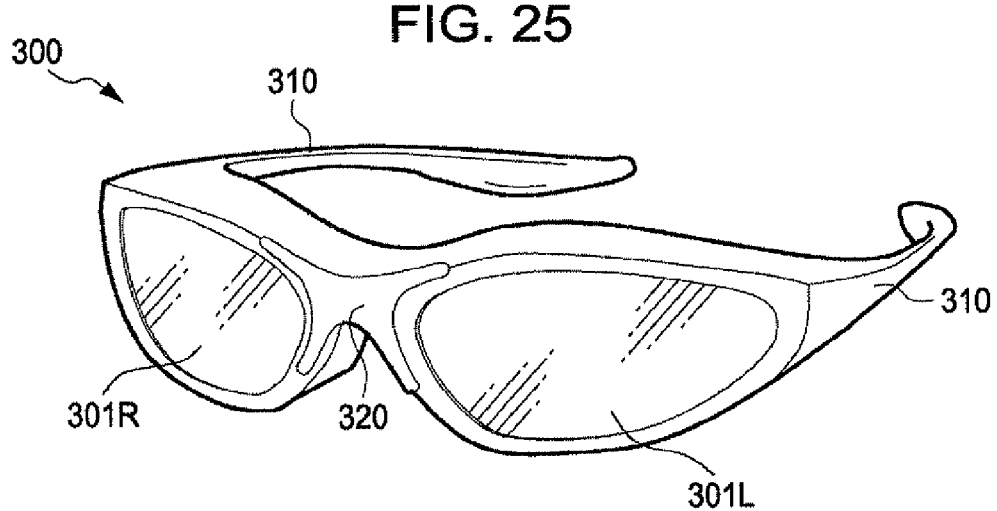
Figure 26:
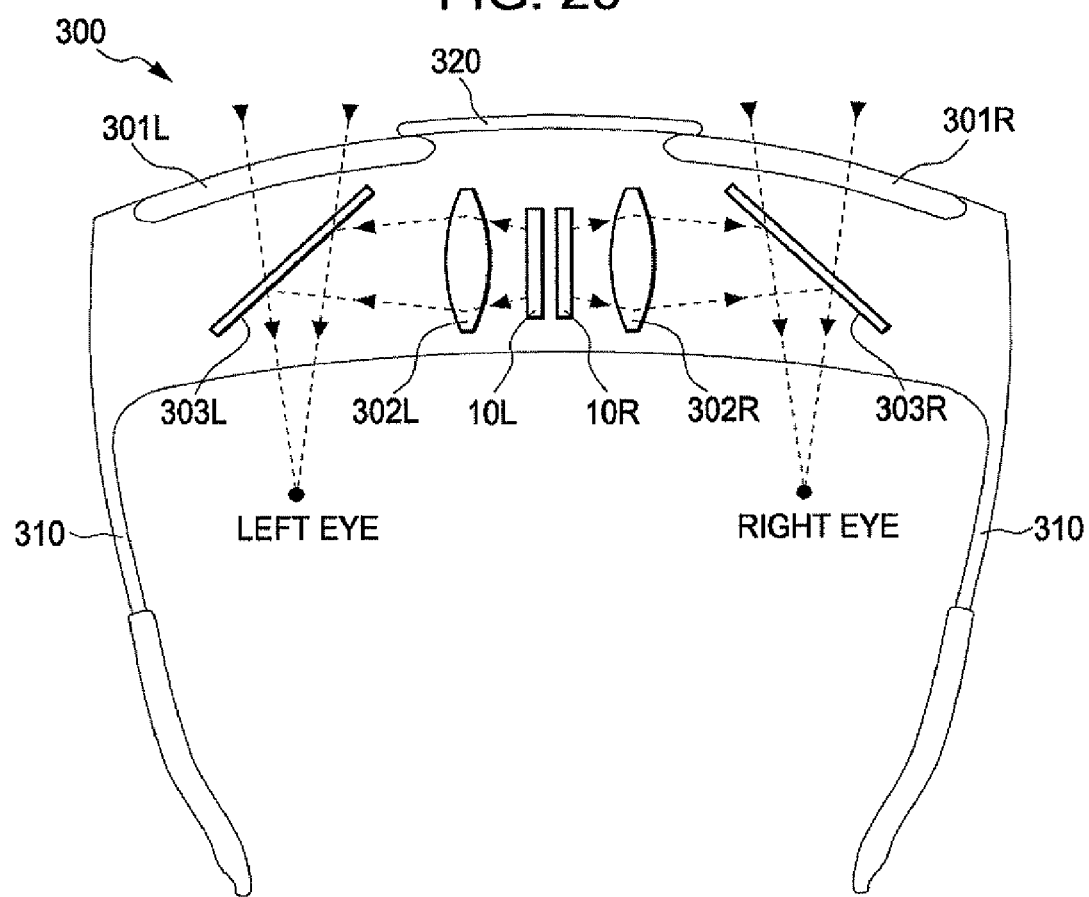
FIG. 26 is a diagram showing the HMD optical configuration.

FIG. 25 is a diagram showing the external appearance of a head mounted display and FIG. 26 is a diagram showing the optical configuration thereof.

First, as shown in FIG. 25, the head mounted display 300 is similar to normal glasses in terms of external appearance and has a temple 310, a bridge 320, and lenses 301L and 301R. In addition, as shown in FIG. 26, the head mounted display 300 is provided with an electro-optical device 10L for the left eye and an electro-optical device 10R for the right eye behind (lower part of the diagram) the lenses 301L and 301R in the vicinity of the bridge 320.

The image display surface of the electro-optical device 10L is arranged so as to be on the left side in FIG. 26. In this manner, the display image according to the electro-optical device 10L is output in the 9 o'clock direction in the diagram through the optical lens 302L. The half mirror 303L reflects the display image according to the electro-optical device 10L in the 6 o'clock direction while allowing light incident from the 12 o'clock direction to pass therethrough.

The image display surface of the electro-optical device 10R is arranged so as to be on the right side opposite to the electro-optical device 10L. In this manner, the display image according to the electro-optical device 10R is output in the 3 o'clock direction in the diagram through the optical lens 302R. The half mirror 303R reflects the display image according to the electro-optical device 10R in the 6 o'clock direction while allowing light incident from the 12 o'clock direction to pass therethrough.

In this configuration, the wearer of the head mounted display 300 can observe the display images according to the electro-optical devices 10L and 10R in a see-through state superimposed and combined with the situation outside.

In addition, in the head mounted display 300, when, in the two parallax images for both eyes, the left eye image is displayed by the electro-optical device 10L and the right eye image is displayed by the electro-optical device 10R, the displayed image can be perceived by the wearer as though having a sense of depth or three-dimensionality (3D display).

Here, in addition to the head mounted display 300, it is also possible to apply the electro-optical device 10 to an electronic type view finder in a video camera, an interchangeable lens-type digital camera, or the like.

What is claimed is:

1. An electro-optical device comprising:
a first capacitor having a first electrode and a second electrode;
a control circuit that supplies a data signal to the first electrode of the first capacitor;
a first wiring electrically connected to the second electrode of the first capacitor;
a second wiring to which a fixed potential is supplied, the second wiring extending along a direction that is parallel with a direction in which the first wiring extends;
a second capacitor having a third electrode electrically connected to the first wiring and a fourth electrode electrically connected to the second wiring;
a pixel circuit electrically connected to the first wiring, the pixel circuit having a pixel capacitor holding a first voltage according to the data signal, the pixel circuit including:
an electro-optical element;
a first transistor that controls current supplied to the electro-optical element when electrically connected to the electro-optical element, the first transistor having a gate electrode;
a second transistor which is electrically connected between the first wiring and a gate of the first transistor and which is configured to be turned on or off;
a third transistor connected between the first transistor and the light emitting element, the third transistor being configured to be turned on or off; and
a fourth transistor connected between the second wiring and the light emitting element, the fourth transistor being configured to be turned on or off, a drain of the fourth transistor being directly connected to the second wiring, and a source of the fourth transistor being directly connected between the third transistor and the light emitting element,
wherein the first voltage is generated based on the data signal and a capacitance ratio of at least the first capacitor and the second capacitor,
a capacitance of the second capacitor is greater than a capacitance of the first capacitor,
the capacitance of the first capacitor is greater than a capacitance of the pixel capacitor,
the pixel capacitor is connected to the gate electrode of the first transistor and a potential voltage change amount of the data signal is compressed at the gate electrode of the first transistor by the capacitance ratio.

2. An electro-optical device comprising:
a first capacitor having a first electrode and a second electrode;
a control circuit that supplies a data signal;
a first wiring electrically connected to the second electrode of the first capacitor;
a second wiring to which a fixed potential is supplied, the second wiring extending along a direction that is parallel with a direction in which the first wiring extends;
a second capacitor having a third electrode electrically connected to the first wiring and a fourth electrode electrically connected to the second wiring;
a pixel circuit electrically connected to the first wiring, the first pixel circuit having a pixel capacitor holding a first voltage according to the data signal, the pixel circuit including:
an electro-optical element;
a first transistor that controls current supplied to the electro-optical element when electrically connected to the electro-optical element, the first transistor having a gate electrode;
a second transistor which is electrically connected between the first wiring and a gate of the first transistor and which is configured to be turned on or off;

a third transistor connected between the first transistor and the light emitting element, the third transistor being configured to be turned on or off; and a fourth transistor connected between the second wiring and the light emitting element, the fourth transistor being configured to be turned on or off, a drain of the fourth transistor being directly connected to the second wiring, and a source of the fourth transistor being directly connected between the third transistor and the light emitting element;

a third capacitor holding a second voltage according to the data signal, the data signal from the control circuit being supplied to the third capacitor;

a switch connected between the first electrode of the first capacitor and the third capacitor, wherein the first voltage is generated based on the second voltage and a capacitance ratio of the first capacitor, the second capacitor and the third capacitor, a capacitance of the second capacitor is greater than a capacitance of the first capacitor, the capacitance of the first capacitor is greater than a capacitance of the pixel capacitor, the pixel capacitor is connected to the gate electrode of the first transistor and a potential voltage change amount of the data signal is compressed at the gate electrode of the first transistor by the capacitance ratio.

3. An electronic apparatus including the electro-optical device according to claim 1.

4. An electronic apparatus including the electro-optical device according to claim 2.

5. The electro-optical device according to claim 1, wherein a capacitance value of the first and second capacitors defines a relation that results in the voltage at the pixel circuit always being a compressed voltage of the data signal.

* * * * *